United States Patent
Kwon

(10) Patent No.: US 9,847,343 B2
(45) Date of Patent: Dec. 19, 2017

(54) CHARGE TRAPPING NONVOLATILE MEMORY DEVICES, METHODS OF FABRICATING THE SAME, AND METHODS OF OPERATING THE SAME

(71) Applicant: SK hynix Inc., Gyeonggi-do (KR)

(72) Inventor: Young Joon Kwon, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/735,954

(22) Filed: Jun. 10, 2015

(65) Prior Publication Data

US 2016/0240542 A1 Aug. 18, 2016

(30) Foreign Application Priority Data

Feb. 17, 2015 (KR) .................. 10-2015-0024489

(51) Int. Cl.
*H01L 27/11* (2006.01)
*H01L 29/792* (2006.01)
*H01L 27/1157* (2017.01)
*H01L 21/28* (2006.01)
*H01L 29/423* (2006.01)

(52) U.S. Cl.
CPC .... *H01L 27/1157* (2013.01); *H01L 21/28282* (2013.01); *H01L 29/42344* (2013.01); *H01L 29/42348* (2013.01); *H01L 29/7923* (2013.01)

(58) Field of Classification Search
CPC .... H01L 29/792; H01L 27/11; H01L 27/1157; H01L 21/28; H01L 21/28282; H01L 29/42; H01L 29/42344; H01L 29/42348; H01L 29/79; H01L 29/7923
See application file for complete search history.

(56) References Cited

U.S. PATENT DOCUMENTS

| 4,964,143 A * | 10/1990 | Haskell ............ H01L 21/28273 257/316 |
| 2002/0020860 A1* | 2/2002 | Arai ...................... H01L 27/105 257/260 |
| 2004/0232475 A1* | 11/2004 | Kataoka ............ H01L 21/28282 257/315 |

(Continued)

*Primary Examiner* — Fazli Erdem
(74) *Attorney, Agent, or Firm* — IP&T Group LLP

(57) ABSTRACT

A charge trapping nonvolatile memory device includes a source region and a drain region disposed in an upper portion of a substrate and spaced apart from each other by a first trapping region, a channel region, and a second trapping region. A gate stack structure is disposed over the channel region. A first stack including a tunnel insulation layer, a first charge trap layer, and a first blocking insulation layer are disposed over the first trapping region. A second stack including a tunnel insulation layer, a second charge trap layer, and a second blocking insulation layer are disposed over the second trapping region. An interlayer insulation layer is disposed over the substrate and covers the gate stack structure. A first contact plug and a second contact plug penetrate the interlayer insulation layer and respectively contact the source region and the drain region. A third contact plug penetrates the interlayer insulation layer, contacts the gate stack structure, and overlaps with the first and the second charge trap layers.

12 Claims, 24 Drawing Sheets

(56) References Cited

U.S. PATENT DOCUMENTS

| | | | |
|---|---|---|---|
| 2005/0051852 A1* | 3/2005 | Kim | H01L 21/28273 257/382 |
| 2007/0007575 A1 | 1/2007 | Ding | |
| 2008/0144377 A1* | 6/2008 | Watanabe | G11C 16/0408 365/185.05 |
| 2010/0006917 A1* | 1/2010 | Masuda | H01L 21/28273 257/316 |
| 2012/0098050 A1* | 4/2012 | Shim | H01L 27/11578 257/324 |
| 2012/0257458 A1* | 10/2012 | Lin | H01L 27/11521 365/185.29 |
| 2012/0314509 A1* | 12/2012 | Lin | G11C 16/0408 365/185.29 |
| 2013/0341797 A1* | 12/2013 | Lim | H01L 23/50 257/773 |
| 2014/0175533 A1* | 6/2014 | Kwon | H01L 21/28282 257/324 |
| 2014/0293708 A1* | 10/2014 | Kwon | H01L 29/792 365/185.23 |
| 2014/0374814 A1* | 12/2014 | Wu | H01L 27/11568 257/326 |
| 2015/0137206 A1* | 5/2015 | Liu | H01L 29/66825 257/316 |
| 2015/0194314 A1* | 7/2015 | Chu | H01L 21/283 257/288 |
| 2015/0303204 A1* | 10/2015 | Kwon | H01L 27/1157 257/324 |
| 2015/0311221 A1* | 10/2015 | Huang | H01L 21/283 257/314 |
| 2016/0211363 A1* | 7/2016 | Park | H01L 29/66825 |
| 2016/0293615 A1* | 10/2016 | Kwon | H01L 29/7883 |

\* cited by examiner

CHARGE TRAPPING NONVOLATILE MEMORY DEVICES, METHODS OF FABRICATING THE SAME, AND METHODS OF OPERATING THE SAME

CROSS-REFERENCE TO RELATED APPLICATION

The present application claims priority under 35 U.S.C 119(a) to Korean Application No. 10-2015-0024489 filed on Feb. 17, 2015, which is herein incorporated by reference in its entirety.

BACKGROUND

1. Technical Field

Various embodiments of the present disclosure relate to nonvolatile memory devices. More particularly to charge trapping nonvolatile memory devices, methods of fabricating the same, and methods of operating the same.

2. Related Art

Semiconductor memory devices are typically categorized as either volatile memory devices or nonvolatile memory devices. Volatile memory devices lose their stored data when their power supplies are interrupted but have relatively high operating speeds. That is, they read out data stored in memory cells or write data into the memory cells relatively quickly. In contrast, nonvolatile memory devices retain their stored data when their power supplies are interrupted but tend to operate at lower speeds. Therefore, nonvolatile memory devices are used in electronic systems that need to retain data without having a constant power source. Nonvolatile memory devices include mask read only memory (MROM) devices, programmable read only memory (PROM) devices, erasable and programmable read only memory (EPROM) devices, electrically erasable and programmable read only memory (EEPROM) devices, flash memory devices, etc.

In general, the MROM devices, the PROM devices, and the EPROM devices need additional equipment such as, a UV irradiator, to erase their stored data. Thus, it may be inconvenient to use MROM devices, PROM devices, and EPROM devices in many applications. In contrast, EEPROM devices and flash memory devices allow data to be electrically erased and written without additional equipment. Accordingly, EEPROM devices and flash memory devices may be applied in various areas, for example, systems for program executions, or auxiliary memory devices performing frequent data renewals. In particular, an erase operation of flash memory devices may be performed by page unit. The flash memory devices are capable of achieving higher integration densities than EEPROM devices. Therefore, flash memory devices are often used in large capacity auxiliary memory devices.

The amount of data that nonvolatile memory devices are capable of storing in each memory cell depends on the number of bits that are stored in each memory cell. A memory cell in which a single bit of data is stored is referred to as a single bit cell or a single level cell (SLC). In contrast, a memory cell in which multi-bit data for example, data including two bits or more, is stored is referred to as a multi-bit cell, a multi-level cell (MLC) or a multi-state cell. As semiconductor memory devices become more highly integrated, nonvolatile memory devices employing MLCs have become more prevalent.

Flash memory and EEPROM devices generally have a stacked gate structure including a floating gate and a control gate electrode, which are vertically stacked. However, if the distance between the memory cells is reduced too much, threshold voltages of the memory cells may become unstable due to interference effects or coupling capacitances between the memory cells. Therefore, a significant amount of research and development is being conducted to determine how memory devices can more effectively store data using charge trapping layers.

SUMMARY

Various embodiments are directed to charge trapping nonvolatile memory devices, methods of fabricating the same, and methods of operating the same.

According to one embodiment, a charge trapping nonvolatile memory device includes a source region and a drain region disposed in an upper portion of a substrate and spaced apart from each other by a first trapping region, a channel region, and a second trapping region. A gate stack structure is disposed over the channel region. A first stack including a tunnel insulation layer, a first charge trap layer, and a first blocking insulation layer are disposed over the first trapping region. A second stack including a tunnel insulation layer, a second charge trap layer, and a second blocking insulation layer are disposed over the second trapping region. An interlayer insulation layer is disposed over the substrate and covering the gate stack structure. A first contact plug and a second contact plug penetrate the interlayer insulation layer and respectively contacting the source region and the drain region. A third contact plug penetrate the interlayer insulation layer, contacting the gate stack structure and overlapping with the first and the second charge trap layers.

According to another embodiment, a charge trapping nonvolatile memory device includes a selection transistor having a MOS structure and including a selection gate terminal, a first terminal, and a second terminal. A first charge storage transistor has a first charge trap structure and includes a first control gate terminal, a source terminal, and one terminal connected to the first terminal of the selection transistor. A second charge storage transistor has a second charge trap structure and includes a second control gate terminal, a drain terminal, and a terminal connected to the second terminal of the selection transistor. The source terminal and the drain terminal are connected to a source line and a bit line, respectively. The selection gate terminal, the first control gate terminal and the second control gate terminal are commonly connected to a single word line.

According to another embodiment, a charge trapping nonvolatile memory device includes a plurality of word lines including first, second, and third word lines and arranged along rows. A plurality of bit lines is respectively disposed along a plurality of columns. A plurality of source lines extends in parallel to the rows. A plurality of unit cells is respectively located at cross points of the rows and the columns. The plurality of unit cells includes a first unit cell located at a Nth row and a Pth column, a second unit cell located at the (N−1)th row and the Pth column, and a third unit cell located at the (N+1)th row and the Pth column, wherein each of N and P is an integer. Each of the first, the second, and the third unit cells includes a first charge storage transistor, a selection transistor, and a second charge storage transistor which are connected in series along a column direction. The first charge storage transistor has a first control gate terminal and a source terminal. The selection transistor has a selection gate terminal. The second charge storage transistor has a second control gate terminal and a drain terminal. The source terminal of the first unit cell is electrically connected to the source terminal of the second unit cell. The first control gate terminal, the selection gate terminal, and the second control gate terminal of the first unit cell are commonly connected to a first word line. The first control gate terminal, the selection gate terminal, and the second control gate terminal of the second unit cell are commonly connected to a second word line. The first control gate terminal, the selection gate terminal, and the second control gate terminal of the third unit cell are commonly connected to a third word line. Drain terminals of the first, the second, and the third unit cells are commonly connected to the same bit line. The source terminals of the first and the second unit cells are commonly connected to the same source line. Bulk regions of the plurality of unit cells are commonly connected to the same well bias line.

According to another embodiment, there is provided a method of fabricating a charge trapping nonvolatile memory device. The method includes forming a gate stack structure including, a gate insulation pattern and a gate conductive pattern over a channel region of a substrate. A first dummy spacer and a second dummy spacer are formed over first and second sidewalls of the gate stack structure, respectively. The first dummy spacer includes a first tunnel insulation layer, a first charge trap layer, a first blocking insulation layer, and a first spacer, and extends to over the substrate. The second dummy spacer includes a second tunnel insulation layer, a second charge trap layer, a second blocking insulation layer, and a second spacer, and extends to over the substrate. A source region and a drain region are formed in upper portions of the substrate to be self-aligned with the first and second dummy spacers, respectively. An interlayer insulation layer is formed over the substrate to cover the gate stack structure, the first and second dummy spacers, the source region and the drain region. The interlayer insulation layer is patterned to form a first contact hole exposing the source region, a second contact hole exposing the drain region, and a third contact hole exposing the gate conductive pattern and the first and second spacers. The first and second spacers exposed by the third contact hole are removed. The first, second and third contact holes are filled with a metal layer to form a first contact plug in the first contact hole, a second contact plug in the second contact hole, and a third contact plug in the third contact hole.

According to another embodiment, there is provided a method of operating a charge trapping nonvolatile memory device including a plurality of word lines including first, second, and third word lines and arranged along rows, a plurality of bit lines respectively disposed along a plurality of columns, a plurality of source lines extending in parallel to the rows, and a plurality of unit cells respectively located at cross points of the rows and the columns, wherein the plurality of unit cells include a first unit cell located at a Nth row and a Pth column, a second unit cell located at the (N−1)th row and the Pth column, and a third unit cell located at the (N+1)th row and the Pth column, wherein each of N and P is an integer, wherein each of the first, the second, and the third unit cells includes a first charge storage transistor, a selection transistor, and a second charge storage transistor which are connected in series along a column direction, wherein the first charge storage transistor has a first control gate terminal and a source terminal, wherein the selection transistor has a selection gate terminal, wherein the second charge storage transistor has a second control gate terminal and a drain terminal, wherein the source terminal of the first unit cell is electrically connected to the source terminal of the second unit cell, wherein the first control gate terminal, the selection gate terminal, and the second control gate terminal of the first unit cell are commonly connected to a first word line, wherein the first control gate terminal, the selection gate terminal, and the second control gate terminal of the second unit cell are commonly connected to a second word line, wherein the first control gate terminal, the selection gate terminal, and the second control gate terminal of the third unit cell are commonly connected to a third word line, wherein drain terminals of the first, the second, and the third unit cells are commonly connected to the same bit line, wherein the source terminals of the first and the second unit cells are commonly connected to the same source line, and wherein bulk regions of the plurality of unit cells are commonly connected to the same well bias line. The method comprises applying a positive program voltage to one selected from the plurality of word lines, applying a ground voltage to the remaining word lines other than the selected word line, applying a ground voltage to one selected from the plurality of bit lines to select the unit cell located at a cross point of the selected word line and the selected bit line, electrically floating the remaining bit lines other than the selected bit line, applying a positive program source line voltage to the source line connected to the selected unit cell, applying a ground voltage to the remaining source lines, and applying a ground voltage to the well bias line to selectively program the first charge storage transistor of the selected unit cell.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "on" "over", "above", "under", "beneath" or "below" another element, it may directly contact the other element, or at least one intervening element may be present therebetween. Accordingly, the terms such as "on", "over", "above", "under", "beneath", "below" and the like that are used herein are for the purpose of describing particular embodiments only and are not intended to limit the scope of the present disclosure.

It will be further understood that when an element is referred to as being "connected" or "coupled" to another element, it can be directly connected or coupled to the other element or intervening elements may be present.

Figure 1:
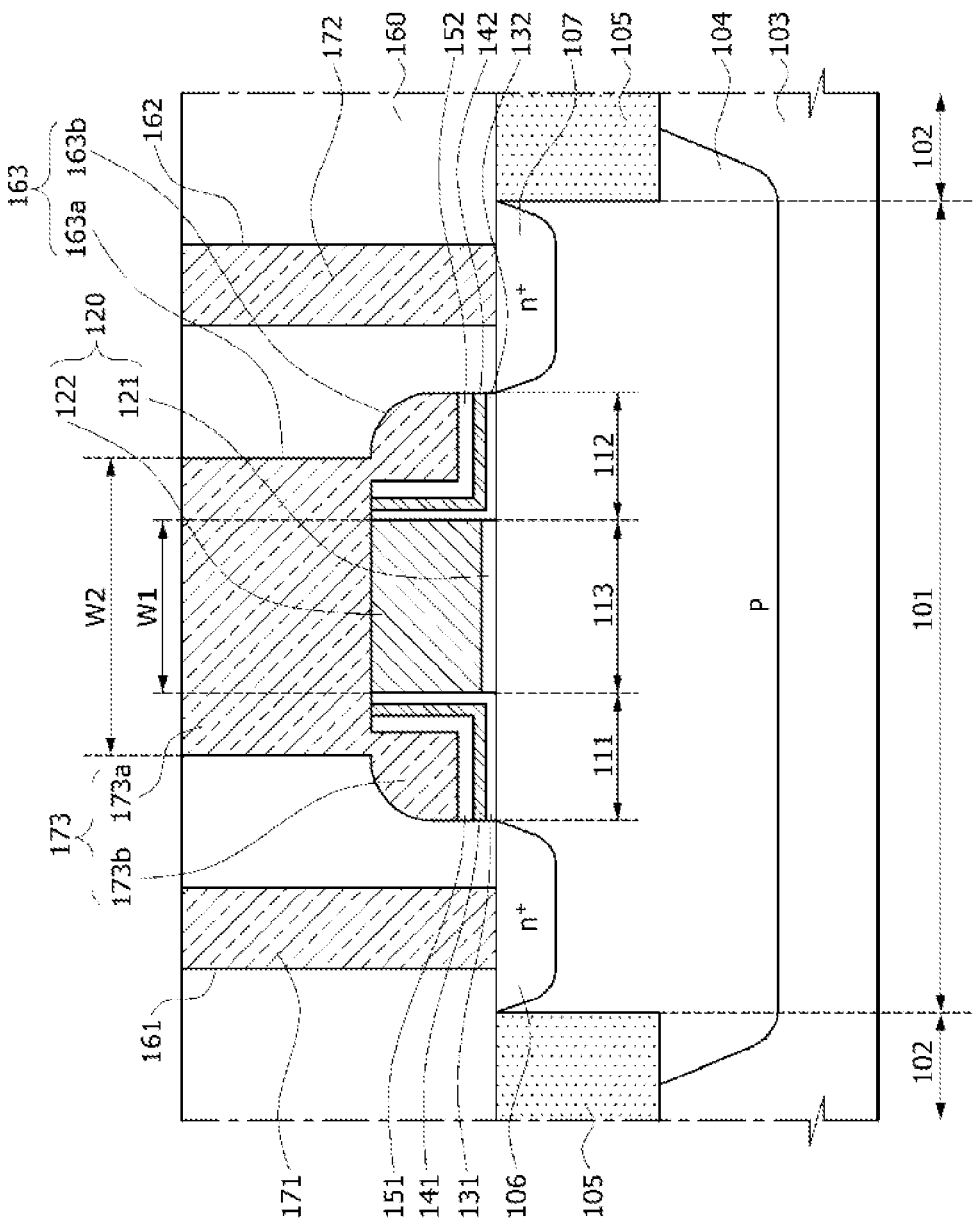
FIG. 1 is a cross-sectional view illustrating a charge trapping nonvolatile memory device according to an embodiment.

FIG. 1 is a cross-sectional view illustrating a charge trapping nonvolatile memory device according to an embodiment. Referring to FIG. 1, a well region 104 of a first conductivity type, for example, a P-type well region may be disposed in an upper portion of a substrate 103. The substrate 103 may be a semiconductor substrate such as a single crystalline silicon substrate. In some embodiments, the substrate 103 may be a silicon-on-insulator (SOI) substrate including a support substrate, a buried insulation layer and a single crystalline silicon layer which are sequentially stacked. If the substrate 103 is P-type, the well region 104 may not be necessary. A portion of an upper portion of the well region 104 may correspond to an active region 101. The active region 101 may be defined by an isolation region 102. A trench isolation layer 105 may be disposed in the isolation region 102. A source region 106 heavily doped with N-type impurities and a drain region 107 heavily doped with N-type impurities may be disposed in the active region 101 and spaced apart from each other. A first trapping region 111, a channel region 113 and a second trapping region 112 may be defined in the well region 104 between the source region 106 and the drain region 107. The channel region 113 may be disposed between the first and second trapping regions 111 and 112. The first trapping region 111 may be disposed between the source region 106 and the channel region 113, and the second trapping region 112 may be disposed between the channel region 113 and the drain region 107.

A gate insulation pattern 121 and a gate conductive pattern 122 may be sequentially stacked on the channel region 113. The gate insulation pattern 121 and the gate conductive pattern 122 may constitute a gate stack structure 120 of a selection transistor. The selection transistor may be configured to have a metal-oxide-semiconductor (MOS) structure which is comprised of the channel region 113, the gate insulation pattern 121 and the gate conductive pattern 122. In some embodiments, the gate insulation pattern 121 may include an oxide layer, and the gate conductive pattern 122 may include a polysilicon layer or a metal layer. If a voltage higher than a threshold voltage of the selection transistor is applied to the gate conductive pattern 122, an inversion layer may be formed in the channel region 113. The inversion layer formed in the channel region 113 may act as a current path through which carriers move.

A first tunnel insulation layer 131, a first charge trap layer 141 and a first blocking insulation layer 151 may be sequentially stacked on the well region 104 in the first trapping region 111. The first tunnel insulation layer 131 may extend to cover an entire surface of a sidewall of the gate stack structure 120. The sidewall may be located opposite to the drain region 107. Accordingly, the first tunnel insulation layer 131 may include one portion disposed on the well region 104 in the first trapping region 111 and the other portion disposed on the sidewall of the gate stack structure 120.

Each of the first charge trap layer 141 and the first blocking insulation layer 151 may also have the same cross-sectional profile as the first tunnel insulation layer 131. Thus, each of the first charge trap layer 141 and the first blocking insulation layer 151 may include one portion disposed on the well region 104 in the first trapping region 111 and the other portion disposed on the sidewall of the gate stack structure 120.

The first tunnel insulation layer 131 may include an oxide layer. The first tunnel insulation layer 131 may have a thickness less than a thickness of the gate insulation pattern 121. The first charge trap layer 141 may include a nitride layer. The first blocking insulation layer 151 may include an oxide layer or a high-k dielectric layer, for example, an aluminum oxide ($Al_2O_3$) layer.

A second tunnel insulation layer 132, a second charge trap layer 142 and a second blocking insulation layer 152 may be sequentially stacked on the well region 104 in the second trapping region 112. The second tunnel insulation layer 132 may extend to cover an entire surface of another sidewall of the gate stack structure 120. The sidewall may be located opposite to the source region 106. Accordingly, the second tunnel insulation layer 132 may include one portion disposed on the well region 104 in the second trapping region 112 and the other portion disposed on the sidewall of the gate stack structure 120.

Each of the second charge trap layer 142 and the second blocking insulation layer 152 may also have the same cross-sectional profile as the second tunnel insulation layer 132. Thus, each of the second charge trap layer 142 and the second blocking insulation layer 152 may include one portion disposed on the well region 104 in the second trapping region 112 and the other portion disposed on the sidewall of the gate stack structure 120.

The second tunnel insulation layer 132 may include an oxide layer. The second tunnel insulation layer 132 may have a thickness less than a thickness of the gate insulation pattern 121. The second charge trap layer 142 may include a nitride layer. The second blocking insulation layer 152 may include an oxide layer or a high-k dielectric layer, for example, an aluminum oxide ($Al_2O_3$) layer.

An interlayer insulation layer 160 may be disposed to cover the trench isolation layer 105, the source and drain regions 106 and 107, the first and second blocking insulation layers 151 and 152, and the gate conductive pattern 122. The interlayer insulation layer 160 may be a single-layered insulation material or a multi-layered insulation material. The source region 106 may be exposed by a first contact hole 161 penetrating the interlayer insulation layer 160, and the drain region 107 may be exposed by a second contact hole 162 penetrating the interlayer insulation layer 160. The gate conductive pattern 122 and the first and second blocking insulation layers 151 and 152 may be exposed by a third contact hole 163 penetrating the interlayer insulation layer 160. The third contact hole 163 may be divided into a third upper contact hole 163a and a third lower contact hole 163b. The third upper contact hole 163a may extend from a top surface level of the interlayer insulation layer 160 to a top surface level of the gate conductive pattern 122 and may have a vertical sidewall or a sloped sidewall. The third lower contact hole 163b may extend from the top surface level of the gate conductive pattern 122 to top surface levels of the first and second blocking insulation layers 151 and 152 and may have a rounded sidewall profile. The third lower contact hole 163b may extend laterally from the sidewall of the third upper contact hole 163a so that the third lower contact hole 163b may have a width greater than a width of the third upper contact hole 163a.

The first, second and third contact holes 161, 162 and 163 may be filled with a first contact plug 171, a second contact plug 172 and a third contact plug 173, respectively. Thus, the first contact plug 171 and the second contact plug 172 may be in contact with the source region 106 and the drain region 107, respectively. In some embodiments, a layer for reducing a contact resistance value, for example, a silicide layer may be disposed between the first contact plug 171 and the source region 106 as well as between the second contact plug 172 and the drain region 107.

The third contact plug 173 may include a third upper contact plug 173a filling the third upper contact hole 163a and a third lower contact plug 173b filling the third lower contact hole 163b. The third upper contact plug 173a and the third lower contact plug 173b may be formed of the same material. That is, the third upper contact plug 173a and the third lower contact plug 173b may constitute a single unified body without any heterogeneous junction therebetween.

The third upper contact plug 173a may laterally extend from over the channel region 113 to over the first and the second trapping layers 111, 112. That is, a width W2 of the third upper contact plug 173a may be greater than a width W1 of the gate conductive pattern 122. Thus, both edges of the third upper contact plug 173a may vertically overlap with a portion of the first trapping region 111 adjacent to the channel region 113 and a portion of the second trapping region 112 adjacent to the channel region 113, respectively.

The third upper contact plug 173a may contact the gate conductive pattern 122. The third lower contact plug 173b may vertically overlap with both of the first and second trapping regions 111 and 112. Both sidewalls of the third lower contact plug 173b may be self-aligned with an edge of the source region 106 adjacent to the first trapping region 111 and an edge of the drain region 107 adjacent to the second trapping region 112, respectively.

The first, second, and third contact plugs 171, 172, and 173 may be formed of the same conductive material. In some embodiments, the first, the second, and the third contact plugs 171, 172, and 173 may be tungsten material. In some other embodiments, each of the first, the second, and the third contact plugs 171, 172, and 173 may include a plurality of metal layers.

In the first trapping region 111, the well region 104, the first tunnel insulation layer 131, the first charge trap layer 141, the first blocking insulation layer 151 and the third contact plug 173 are vertically stacked and may constitute a first charge storage transistor. In the first charge storage transistor, the third contact plug 173 may serve as a control gate electrode, and the first tunnel insulation layer 131, the first charge trap layer 141 and the first blocking insulation layer 151 may serve as a gate insulation layer.

In the second trapping region 112, the well region 104, the second tunnel insulation layer 132, the second charge trap layer 142, the second blocking insulation layer 152 and the third contact plug 173 are vertically stacked and may constitute a second charge storage transistor. In the second charge storage transistor, the third contact plug 173 may serve as a control gate electrode. The second tunnel insulation layer 132, the second charge trap layer 142 and the second blocking insulation layer 152 may serve as a gate insulation layer.

In the first trapping region 111, when a vertical electric field exceeding a certain threshold value is applied to between the third contact plug 173 and the well region 104, hot carriers generated in the vicinity of the source region 106 may penetrate the first tunnel insulation layer 131 and may be trapped in the first charge trap layer 141.

Similarly, in the second trapping region 112, when a vertical electric field exceeding a certain threshold value is applied between the third contact plug 173 and the well region 104, hot carriers generated in the vicinity of the drain region 107 may penetrate the second tunnel insulation layer 132 and may be trapped in the second charge trap layer 142.

In such a case, the third contact plug 173 may function as a control gate electrode to which a voltage creating the vertical electric field is applied. According to an embodiment, the third contact plug 173 may be formed of metal, for example, the same metal as the first and second contact plugs 171 and 172. Since the third contact plug 173 is formed of metal, rather than polysilicon, an operation speed of the charge trapping nonvolatile memory device according to an embodiment may be improved as compared with a conventional nonvolatile memory device employing a polysilicon layer as control gate electrodes.

Figure 2:
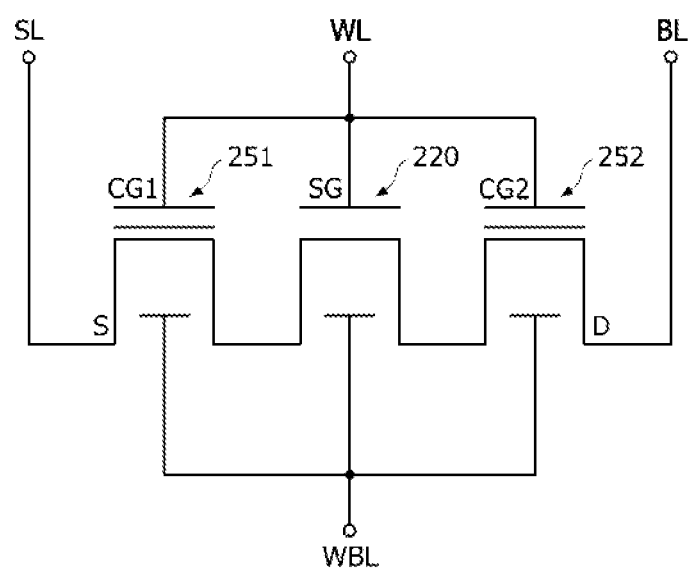
FIG. 2 is an equivalent circuit diagram of the charge trapping nonvolatile memory device shown in FIG. 1.

FIG. 2 is an equivalent circuit diagram of the charge trapping nonvolatile memory device shown in FIG. 1. Referring to FIG. 2, a first charge storage transistor 251 having a first charge trap structure, a selection transistor 220, and a second charge storage transistor 252 having a second charge trap structure may be connected in series to each other.

The first charge storage transistor 251 may include a source terminal S connected to a source line SL. Another terminal of the first charge storage transistor 251 may be connected to the selection transistor 220. In addition, the second charge storage transistor 252 may include a drain terminal D connected to a bit line BL. Another terminal of the second charge storage transistor 252 may be connected to another terminal of the selection transistor 220.

The first charge trap structure of the first charge storage transistor 251 may include a first tunnel insulation layer, a first charge trap layer, and a first blocking insulation layer which are sequentially stacked, as described with reference to FIG. 1. Moreover, the second charge trap structure of the second charge storage transistor 252 may include a second tunnel insulation layer, a second charge trap layer, and a second blocking insulation layer which are sequentially stacked, as described with reference to FIG. 1. A selection gate terminal SG of the selection transistor 220, a first control gate terminal CG1 of the first charge storage transistor 251, and a second control gate terminal CG2 of the second charge storage transistor 252 may be connected to a single or a common word line WL.

Referring to FIGS. 1 and 2, the selection gate terminal SG of the selection transistor 220 may correspond to the gate conductive pattern 122 and the third contact plug 173, and the first control gate terminal CG1 of the first charge storage transistor 251 and the second control gate terminal CG2 of the second charge storage transistor 252 may correspond to the third contact plug 173.

In addition, the source terminal S of the first charge storage transistor 251 may correspond to the source region 106, and the drain terminal D of the second charge storage transistor 252 may correspond to the drain region 107. Moreover, the first charge storage transistor 251, the selection transistor 220 and the second charge storage transistor 252 may share the well region 104 with each other, and the well region 104 may be connected to a well bias line WBL.

Figure 3:
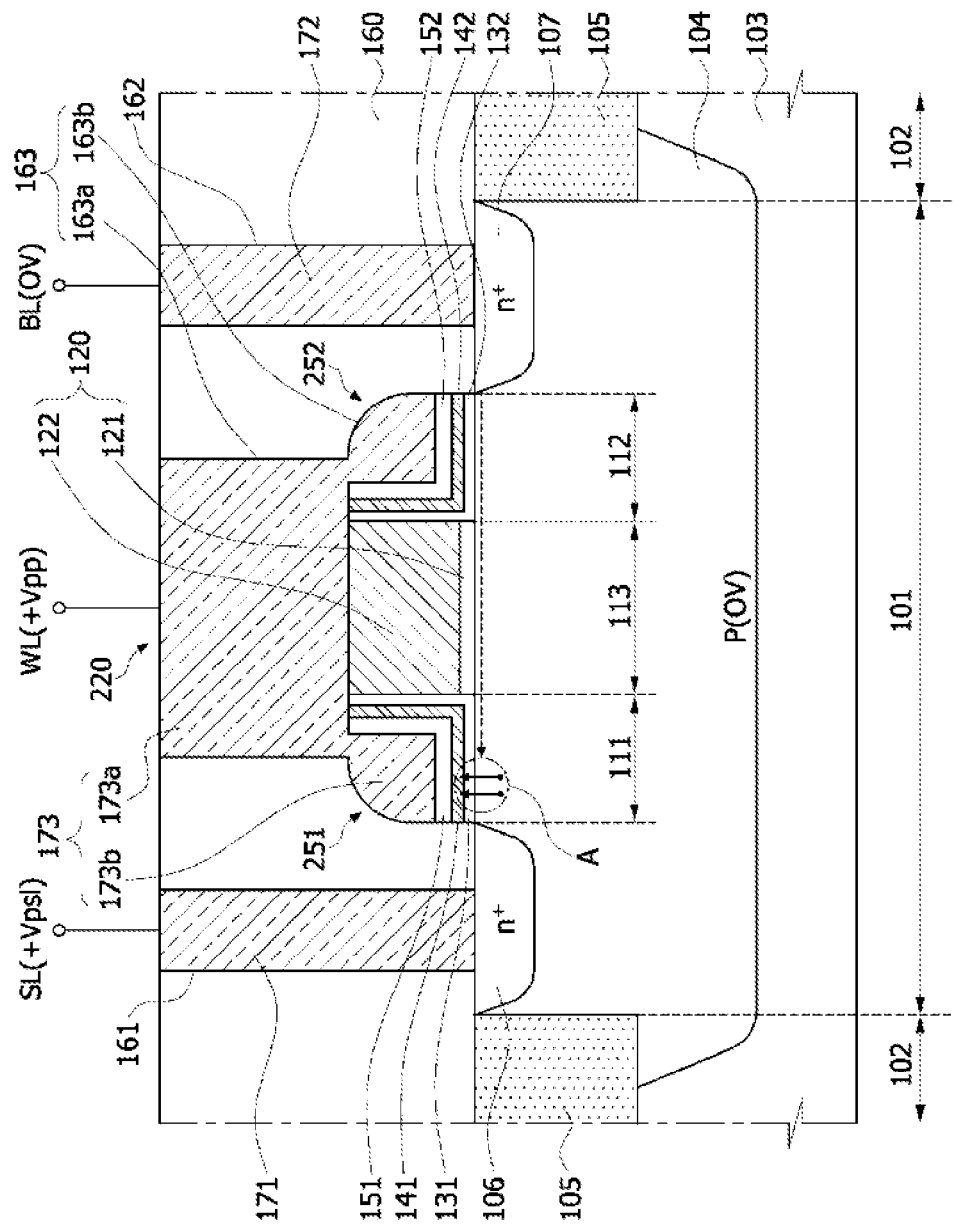
FIG. 3 is a cross-sectional view illustrating a program operation of a first charge storage transistor of the charge trapping nonvolatile memory device shown in FIG. 1.

FIG. 3 is a cross-sectional view illustrating a program operation of the first charge storage transistor of the charge trapping nonvolatile memory device shown in FIG. 1. In the following embodiments, a program operation is executed by positively increasing a threshold voltage of the charge storage transistor. An erasure operation is executed by lowering that is, negatively increasing, the threshold voltage of the charge storage transistor. However, the program operation and the erasure operation executed in the following embodiments are exemplary embodiments and are not limited thereto. Moreover, a program operation for lowering a threshold voltage of the charge storage transistors and an erasure operation for increasing a threshold voltage of the charge storage transistors may be available, as well.

In FIG. 3, the same reference numerals as used in FIGS. 1 and 2 denote the same or the like elements. Referring to FIG. 3, in order to program the first charge storage transistor 251, a positive program voltage +Vpp may be applied to the word line WL and a positive program source line voltage +Vpsl may be applied to the source line SL. In such a case, the bit line BL and the well region 104 may be grounded. In some embodiments, the positive program voltage +Vpp may be higher than threshold voltages of the selection transistor 220 and the second charge storage transistor 252, and may have a sufficient voltage level to inject hot electrons generated in the vicinity of the source region 106 into the first charge trap layer 141 through the first tunnel insulation layer 131. In some embodiments, the positive program source line voltage +Vpsl may have a sufficient voltage level to create a horizontal electric field which is capable of generating the hot electrons in the vicinity of the source region 106. The positive program voltage +Vpp and the positive program source line voltage +Vpsl may be different from each other according to generation mechanisms of hot electrons.

The positive program voltage +Vpp may be applied to the third contact plug 173 and the gate conductive pattern 122 through the word line WL. Accordingly, the selection transistor 220 and the second charge storage transistor 252 may be turned on. That is, inversion layers may be formed in the channel region 113 and the second trapping region 112.

In addition, since the bit line BL is grounded and the positive program source line voltage +Vpsl is applied to the source line SL, a horizontal electric field corresponding to the positive program source line voltage +Vpsl may be created between the source region 106 and the inversion layers in the channel region 113 and the second trapping region 112. Thus, carriers that is, electrons may be drifted from the drain region 107 of the second charge storage transistor 252 toward the source region 106 of the first charge storage transistor 251, as indicated by the arrow in a dotted line shown in FIG. 3.

Moreover, since the positive program voltage +Vpp is applied to the third contact plug 173 through the word line WL and the well region 104 is grounded, a vertical electric field corresponding to the positive program voltage +Vpp may be created in the first trapping region 111. As a result, hot electrons generated in the vicinity of the source region 106 by the horizontal electric field may be injected into the first charge trap layer 141 through the first tunnel insulation layer 131 by the vertical electric field. (See portion "A" of FIG. 3). Therefore, the threshold voltage of the first charge storage transistor 251 may increase such that the first charge storage transistor 251 has a programmed state.

Figure 4:
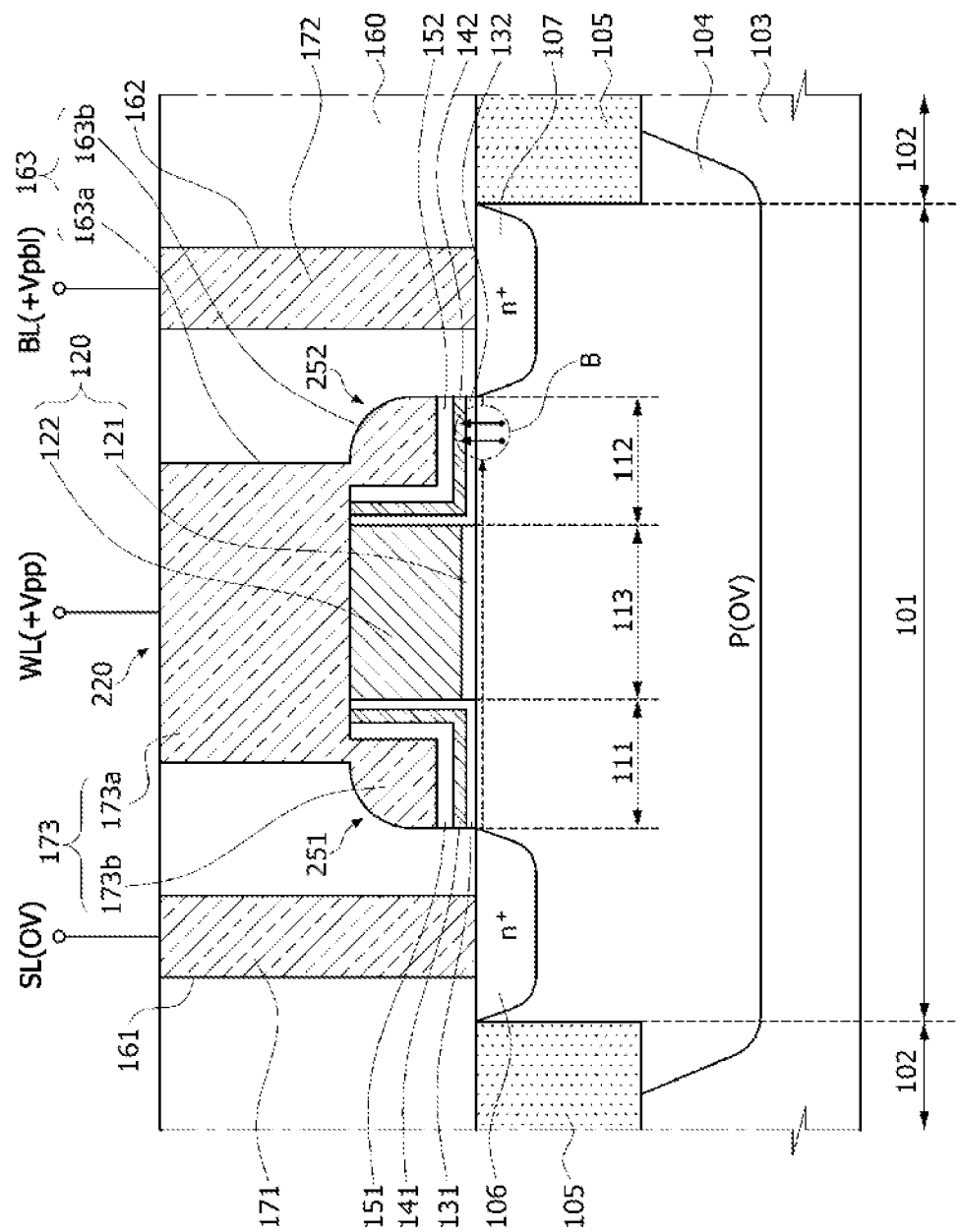
FIG. 4 is a cross-sectional view illustrating a program operation of a second charge storage transistor of the charge trapping nonvolatile memory device shown in FIG. 1.

FIG. 4 is a cross-sectional view illustrating a program operation of the second charge storage transistor of the charge trapping nonvolatile memory device shown in FIG. 1. In FIG. 4, the same reference numerals as used in FIGS. 1 and 2 denote the same elements. Referring to FIG. 4, in order to program the second charge storage transistor 252, the positive program voltage +Vpp may be applied to the word line WL and a positive program bit line voltage +Vpbl may be applied to the bit line BL.

In such a case, the source line SL and the well region 104 may be grounded. The positive program voltage +Vpp may be higher than threshold voltages of the selection transistor 220 and the first charge storage transistor 251 and may have a sufficient voltage level to inject hot electrons generated in the vicinity of the drain region 107 into the second charge trap layer 142 through the second tunnel insulation layer 132. The positive program bit line voltage +Vpbl may have a sufficient voltage level to create a horizontal electric field which is capable of generating the hot electrons in the vicinity of the drain region 107. The positive program voltage +Vpp and the positive program bit line voltage +Vpbl may be set to be different according to generation mechanisms of hot electrons.

The positive program voltage +Vpp may be applied to the third contact plug 173 and the gate conductive pattern 122 through the word line WL. Accordingly, the selection transistor 220 and the first charge storage transistor 251 may be turned on. That is, inversion layers may be formed in the channel region 113 and the first trapping region 111. In addition, since the source line SL is grounded and the positive program bit line voltage +Vpbl is applied to the bit line BL, a horizontal electric field corresponding to the positive program bit line voltage +Vpbl may be created between the drain region 107 and the inversion layers in the channel region 113 and the first trapping region 111. Thus, carriers that is, electrons may be drifted from the source region 106 of the first charge storage transistor 251 toward the drain region 107 of the second charge storage transistor 252, as indicated by an arrow of a dotted line.

Moreover, since the positive program voltage +Vpp is applied to the third contact plug 173 through the word line WL and the well region 104 is grounded, a vertical electric field corresponding to the positive program voltage +Vpp may be created in the second trapping region 112. As a result, hot electrons generated in the vicinity of the drain region 107 by the horizontal electric field may be injected into the second charge trap layer 142 through the second tunnel insulation layer 132 by the vertical electric field. (See portion "B" of FIG. 4). Therefore, the threshold voltage of the second charge storage transistor 252 may increase such that the second charge storage transistor 252 has a programmed state.

Figure 5:
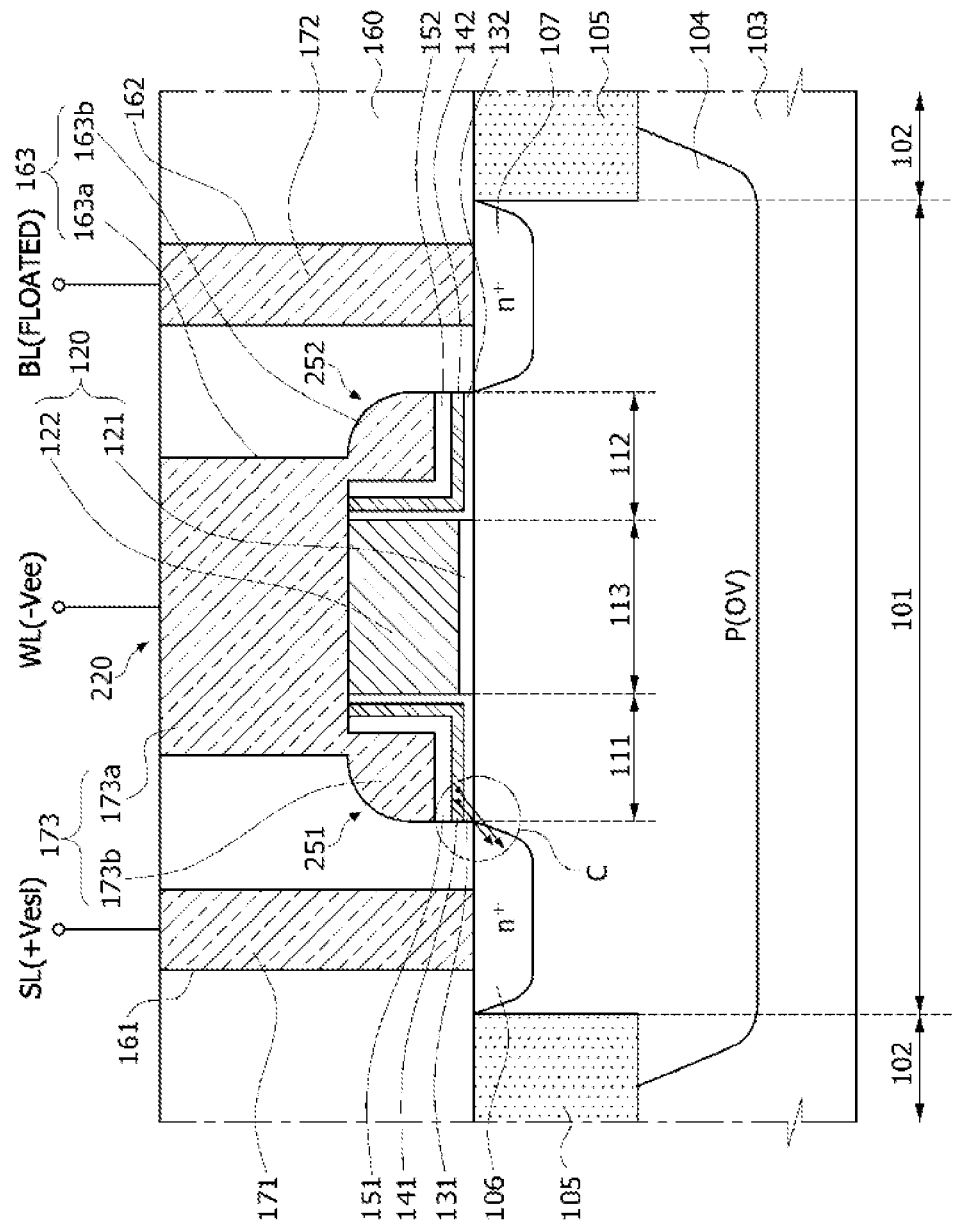
FIG. 5 is a cross-sectional view illustrating a selective erasure operation of the charge trapping nonvolatile memory device shown in FIG. 1.

FIG. 5 is a cross-sectional view illustrating a selective erasure operation of the charge trapping nonvolatile memory device shown in FIG. 1. In FIG. 5, the same reference numerals as used in FIGS. 1 and 2 denote the same elements. Referring to FIG. 5, in order to selectively erase data stored in the first charge storage transistor 251, a negative erasure voltage −Vee may be applied to the word line WL and a positive erasure source line voltage +Vesl may be applied to the source line SL. In such a case, the bit line BL may be floated and the well region 104 may be grounded.

The negative erasure voltage −Vee and the positive erasure source line voltage +Vesl may be set such that electrons trapped in the first charge trap layer 141 are injected into the source region 106 by a band-to-band-tunneling (BTBT) mechanism. Moreover, the negative erasure voltage −Vee may be set such that electrons trapped in the second charge trap layer 142 are not injected into the well region 104 which is grounded.

The negative erasure voltage −Vee may be applied to the third contact plug 173 and the gate conductive pattern 122 through the word line WL. In addition, the positive erasure source line voltage +Vesl may be applied to the source region 106 through the source line SL. Thus, an electric field corresponding to a voltage difference between the negative erasure voltage −Vee and the positive erasure source line voltage +Vesl may be created between the third contact plug 173, which serves as the first control gate terminal CG1 of the first charge storage transistor 251, and the source region 106 of the first charge storage transistor 251. Accordingly, the electrons trapped in the first charge trap layer 141 may be injected into the source region 106 by a BTBT mechanism (See portion "C" of FIG. 5). As a result, the threshold voltage of the first charge storage transistor 251 may be lowered such that the first charge storage transistor 251 has an erased state.

While the first charge storage transistor 251 is erased, no electric field is created between the third contact plug 173 and the drain region 107 since the bit line BL connected to the drain region 107 is electrically floated. An electric field corresponding to the negative erasure voltage −Vee may be created between the third contact plug 173 and the well region 104 in the second trapping region 112. As described above, the negative erasure voltage −Vee may be set such that electrons trapped in the second charge trap layer 142 are not injected into the well region 104 which is grounded. Accordingly, the second charge storage transistor 252 may not be erased while the first charge storage transistor 251 is erased.

The second charge storage transistor 252 may also be selectively erased using substantially the same manner as the selective erasure operation for selectively erasing the first charge storage transistor 251. In such a case, the source line SL may be floated, and a positive erasure bit line voltage +Vebl may be applied to the bit line BL. The positive erasure bit line voltage +Vebl may have the same voltage level as the positive erasure source line voltage +Vesl.

As described above, any one of the first and second charge storage transistors 251 and 252 may be selectively erased. If the charge trapping nonvolatile memory device shown in FIG. 1 is repeatedly arrayed to provide a cell array, the first and second charge storage transistors 251 and 252 sharing a single word line WL may belong to two different pages, respectively. In such a case, the first charge storage transistors 251 or the second charge storage transistors 252 may be selectively erased by performing an erase operation by unit of page using the selective erasure method as described with reference to FIG. 5.

Figure 6:
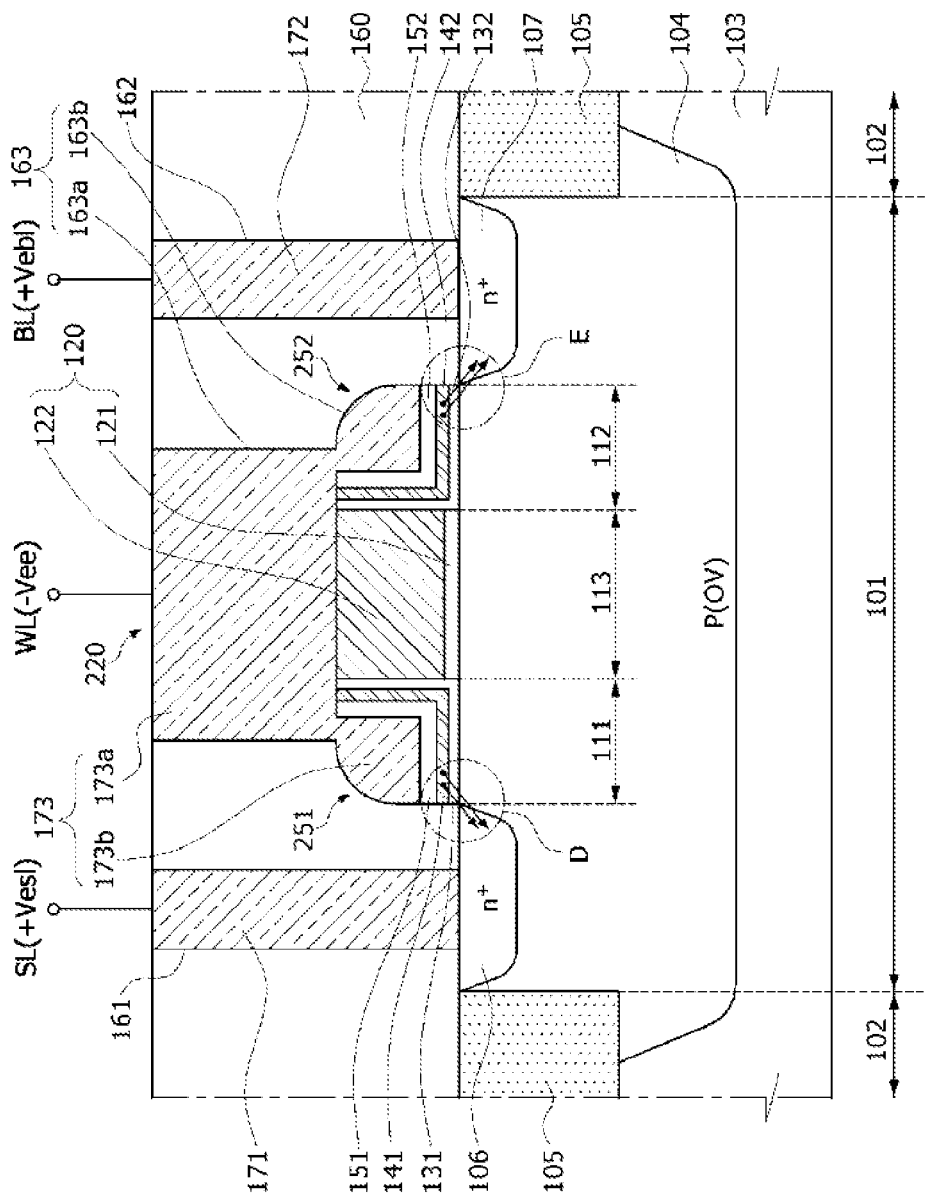
FIG. 6 is a cross-sectional view illustrating a bulk erasure operation of the charge trapping nonvolatile memory device shown in FIG. 1.

FIG. 6 is a cross-sectional view illustrating a bulk erasure operation of the charge trapping nonvolatile memory device shown in FIG. 1. In FIG. 6, the same reference numerals as used in FIGS. 1 and 2 denote the same elements. Referring to FIG. 6, in order to simultaneously erase data stored in the first and second charge storage transistors 251 and 252 in bulk, a negative erasure voltage −Vee may be applied to the word line WL, and a positive erasure source line voltage +Vesl and a positive erasure bit line voltage +Vebl may be respectively applied to the source line SL and the bit line BL. The positive erasure source line voltage +Vesl and the positive erasure bit line voltage +Vebl may have the same voltage level. The well region 104 may be grounded to simultaneously erase the first and second charge storage transistors 251 and 252 in bulk.

The negative erasure voltage −Vee and the positive erasure source line voltage +Vesl may be set such that electrons trapped in the first charge trap layer 141 are injected into the source region 106 by a BTBT mechanism. Similarly, the negative erasure voltage −Vee and the positive erasure bit line voltage +Vebl may be set such that electrons trapped in the second charge trap layer 142 are injected into the drain region 107 by a BTBT mechanism.

The negative erasure voltage −Vee may be applied to the third contact plug 173 and the gate conductive pattern 122 through the word line WL. In addition, the positive erasure source line voltage +Vesl may be applied to the source region 106 through the source line SL. Thus, an electric field corresponding to a voltage difference between the negative erasure voltage −Vee and the positive erasure source line voltage +Vesl may be created between the third contact plug 173 serving as the first control gate terminal CG1 of the first charge storage transistor 251 and the source region 106 of the first charge storage transistor 251. Accordingly, the electrons trapped in the first charge trap layer 141 may be injected into the source region 106 by a BTBT mechanism (See portion "D" of FIG. 6). As such, the threshold voltage of the first charge storage transistor 251 may be lowered when the first charge storage transistor 251 has an erased state.

While the first charge storage transistor 251 is erased, the negative erasure voltage −Vee may be applied to the third contact plug 173 and the gate conductive pattern 122 through the word line WL, and the positive erasure bit line voltage +Vebl may be applied to the drain region 107 through the bit line BL. Thus, an electric field corresponding to a voltage difference between the negative erasure voltage −Vee and the positive erasure bit line voltage +Vebl may be created between the third contact plug 173 serving as the second control gate terminal CG2 of the second charge storage transistor 252 and the drain region 107 of the second charge storage transistor 252. Accordingly, the electrons trapped in the second charge trap layer 142 may be injected into the drain region 107 by a BTBT mechanism (See portion "E" of FIG. 6). As such, the threshold voltage of the second charge storage transistor 252 may be lowered when the second charge storage transistor 252 has an erased state.

According to the bulk erasure method described with reference to FIG. 6, all of the first and second charge storage transistors 251 and 252 may be simultaneously erased by a BTBT mechanism in bulk. Thus, if the charge trapping nonvolatile memory device shown in FIG. 1 is repeatedly arrayed to provide a cell array, all of the first and second charge storage transistors 251 and 252 may be simultaneously erased by unit of block regardless of configuration of a page buffer circuit.

Figure 7:
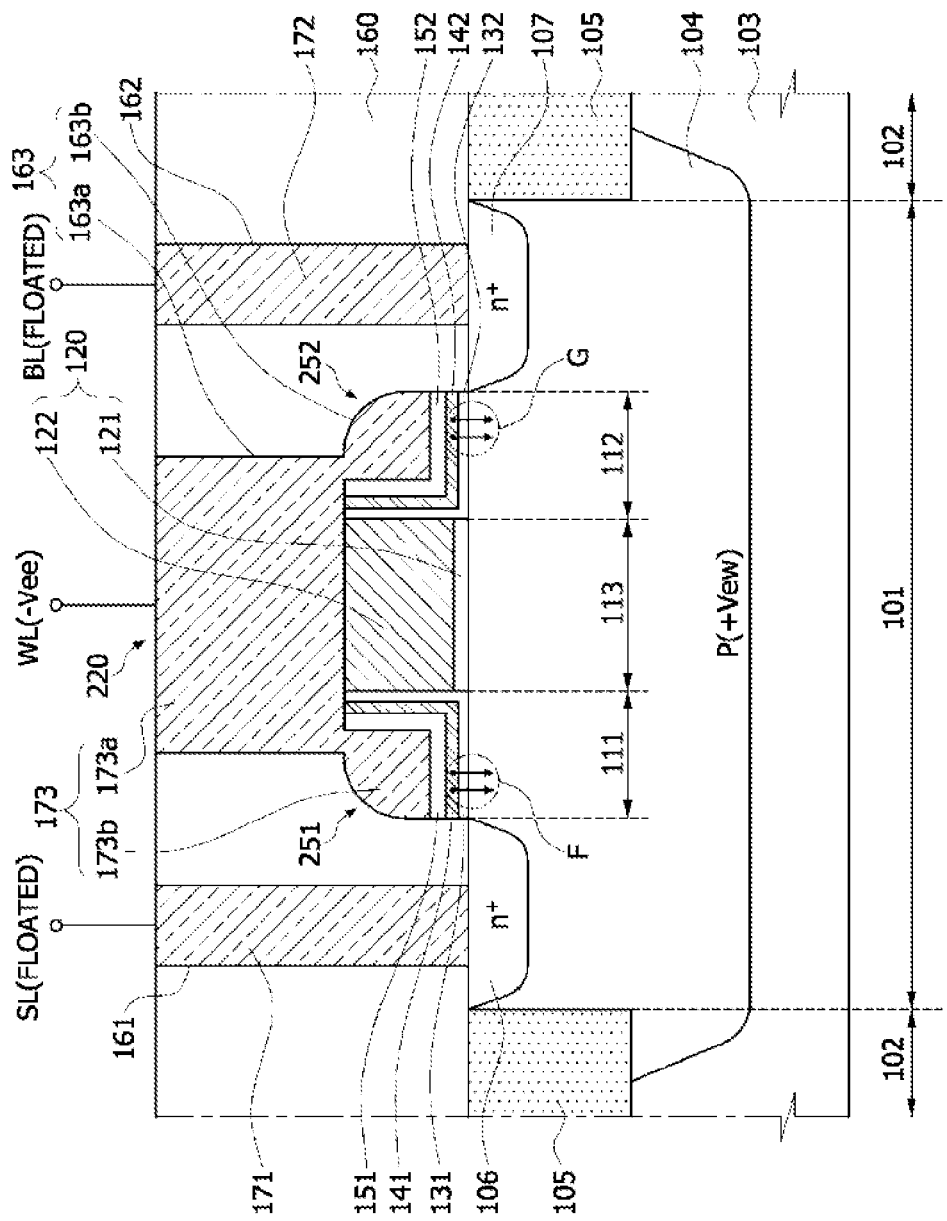
FIG. 7 is a cross-sectional view illustrating another bulk erasure operation of the charge trapping nonvolatile memory device shown in FIG. 1.

FIG. 7 is a cross-sectional view illustrating another bulk erasure operation of the charge trapping nonvolatile memory device shown in FIG. 1. In FIG. 7, the same reference numerals as used in FIGS. 1 and 2 denote the same elements. Referring to FIG. 7, in order to simultaneously erase data stored in the first and second charge storage transistors 251 and 252 in bulk, a negative erasure voltage −Vee may be applied to the word line WL, and the source line SL and the bit line BL may be electrically floated. In the present embodiment, a positive erasure well voltage +Vew may be applied to the well region 104. The negative erasure voltage −Vee and the positive erasure well voltage +Vew may be set such that electrons trapped in the first and second charge trap layers 141 and 142 are injected into the well region 104 by a Fowler-Nordheim (FN) tunneling mechanism.

The negative erasure voltage −Vee may be applied to the third contact plug 173 and the gate conductive pattern 122 through the word line WL while the positive erasure well voltage +Vew is applied to the well region 104. Thus, an electric field corresponding to a voltage difference between the negative erasure voltage −Vee and the positive erasure well voltage +Vew may be created between the third contact plug 173, which serves as the first and second control gate terminals CG1 and CG2 of the first and second charge storage transistors 251 and 252, and the well region 104. Accordingly, the electrons trapped in the first charge trap layer 141 may be injected into the well region 104 by an FN tunneling mechanism. (See portion "F" of FIG. 7). The electrons trapped in the second charge trap layer 142 may also be injected into the well region 104 by an EN tunneling mechanism. (See portion "G" of FIG. 7). As such, the threshold voltages of the first and second charge storage transistors 251 and 252 may be set low when both of the first and second charge storage transistors 251 and 252 have an erased state.

According to the bulk erasure method described with reference to FIG. 7, all of the first and second charge storage transistors 251 and 252 may be simultaneously erased by an FN tunneling mechanism in bulk. Thus, if the charge trapping nonvolatile memory device shown in FIG. 1 is repeatedly arrayed to provide a cell array, all of the first and second charge storage transistors 251 and 252 may be simultaneously erased by unit of block regardless of configuration of a page buffer circuit.

Figure 8:
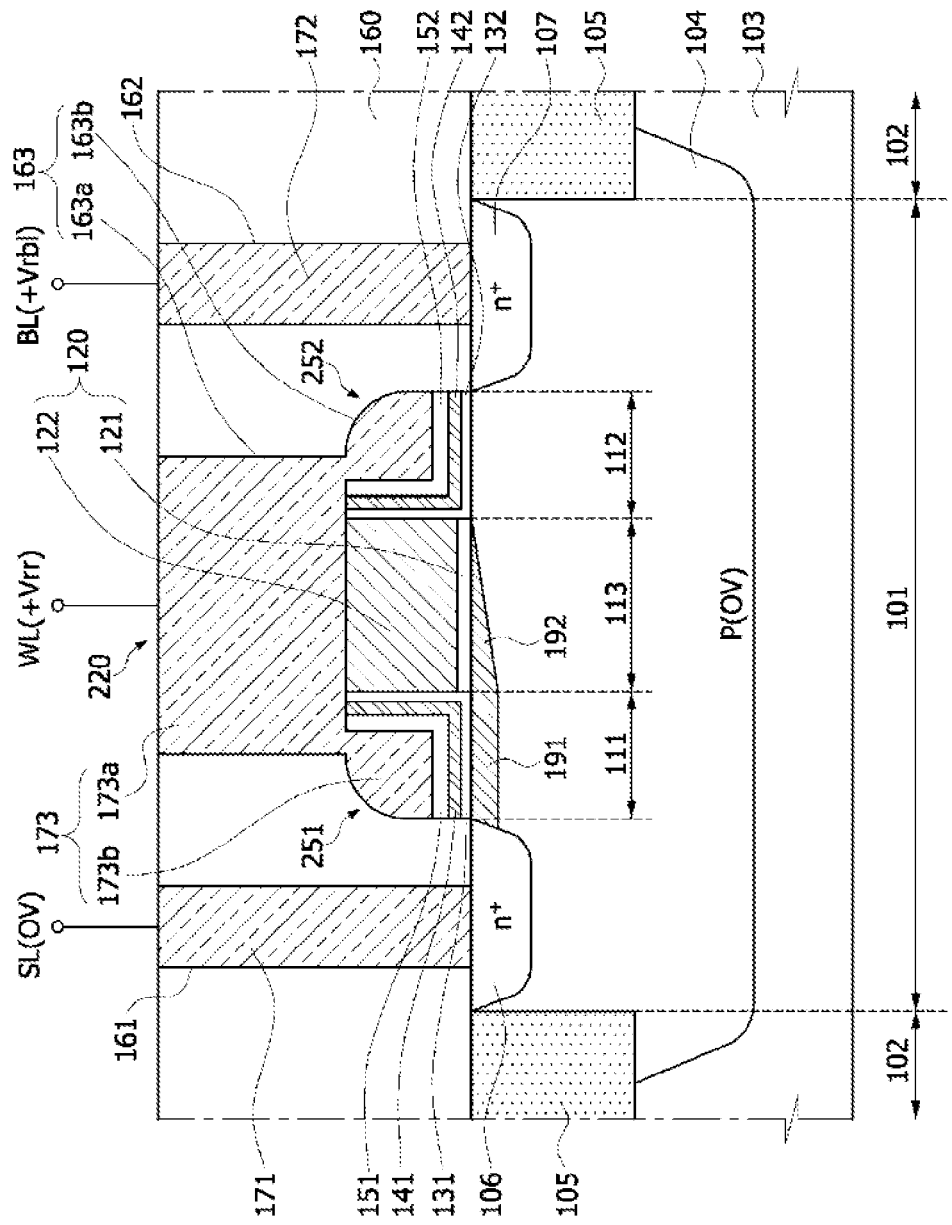
FIG. 8 is a cross-sectional view illustrating a read operation of the first charge storage transistor of the charge trapping nonvolatile memory device shown in FIG. 1.

FIG. 8 is a cross-sectional view illustrating a read operation of the first charge storage transistor 251 of the charge trapping nonvolatile memory device shown in FIG. 1. In FIG. 8, the same reference numerals as used in FIGS. 1 and 2 denote the same elements. Referring to FIG. 8, in order to read out data stored in the first charge storage transistor 251, a positive read voltage +Vrr may be applied to the word line WL and a positive read bit line voltage +Vrbl may be applied to the bit line BL. The source line SL and the well region 104 may be grounded. The positive read voltage +Vrr may be higher than a threshold voltage of the selection transistor 220. In addition, the positive read voltage +Vrr may have an inter-level between a threshold voltage of the first charge storage transistor 251 having an erased state and a threshold voltage of the first charge storage transistor 251 having a programmed state. In some embodiments, the positive read bit line voltage +Vrbl may have a sufficient voltage level to completely deplete the second trapping region 112.

The positive read voltage +Vrr may be applied to the third contact plug 173 and the gate conductive pattern 122 through the word line WL. Accordingly, the selection transistor 220 may be turned on such that an inversion layer is formed in the channel region 113. An inversion layer may be formed in the first trapping region 111 if the first charge storage transistor 251 has an erased state, but no inversion layer may be formed in the first trapping region 111 if the first charge storage transistor 251 has a programmed state.

First, the read operation of the first charge storage transistor 251 having an erased state will be described hereinafter. Specifically, the first charge storage transistor 251 and the selection transistor 220 may be turned on such that a first inversion layer 191 and a second inversion layer 192 are formed in the first trapping region 111 and the channel region 113, respectively. The first and second inversion layers 191 and 192 may serve as current paths through which carriers move. Additionally, since the positive read bit line voltage +Vrbl is applied to the drain region 107 through the bit line BL, the second trapping region 112 may be fully depleted by a surface punch-through phenomenon and serve as an extension of the drain region 107. Thus, electrons may be drifted from the source region 106 to the drain region 107 by a voltage difference between the source region 106 and the drain region 107. That is, a channel current may flow from the drain region 107 to the source region 106. Accordingly, a sense amplifier (not shown) connected to the bit line BL may sense the channel current, indicating that the first charge storage transistor 251 is in an erased state.

Next, a read operation of the first charge storage transistor 251 having a programmed state will be described hereinafter. Specifically, while the selection transistor 220 is turned on, the first charge storage transistor 251 may be turned off. Thus, the second inversion layer 192 is formed in the channel region 113, but the first inversion layer 191 may not be formed in the first trapping region 111. Therefore, since the positive read bit line voltage +Vrbl is applied to the drain region 107 through the bit line BL, the second trapping region 112 may be fully depleted by a surface punch-through phenomenon and serve as an extension of the drain region 107. However, since no inversion layer is formed in the first trapping region 111, no channel current may flow between the source region 106 and the drain region 107. Accordingly, this indicates that the first charge storage transistor 251 is in a programmed state.

Figure 9:
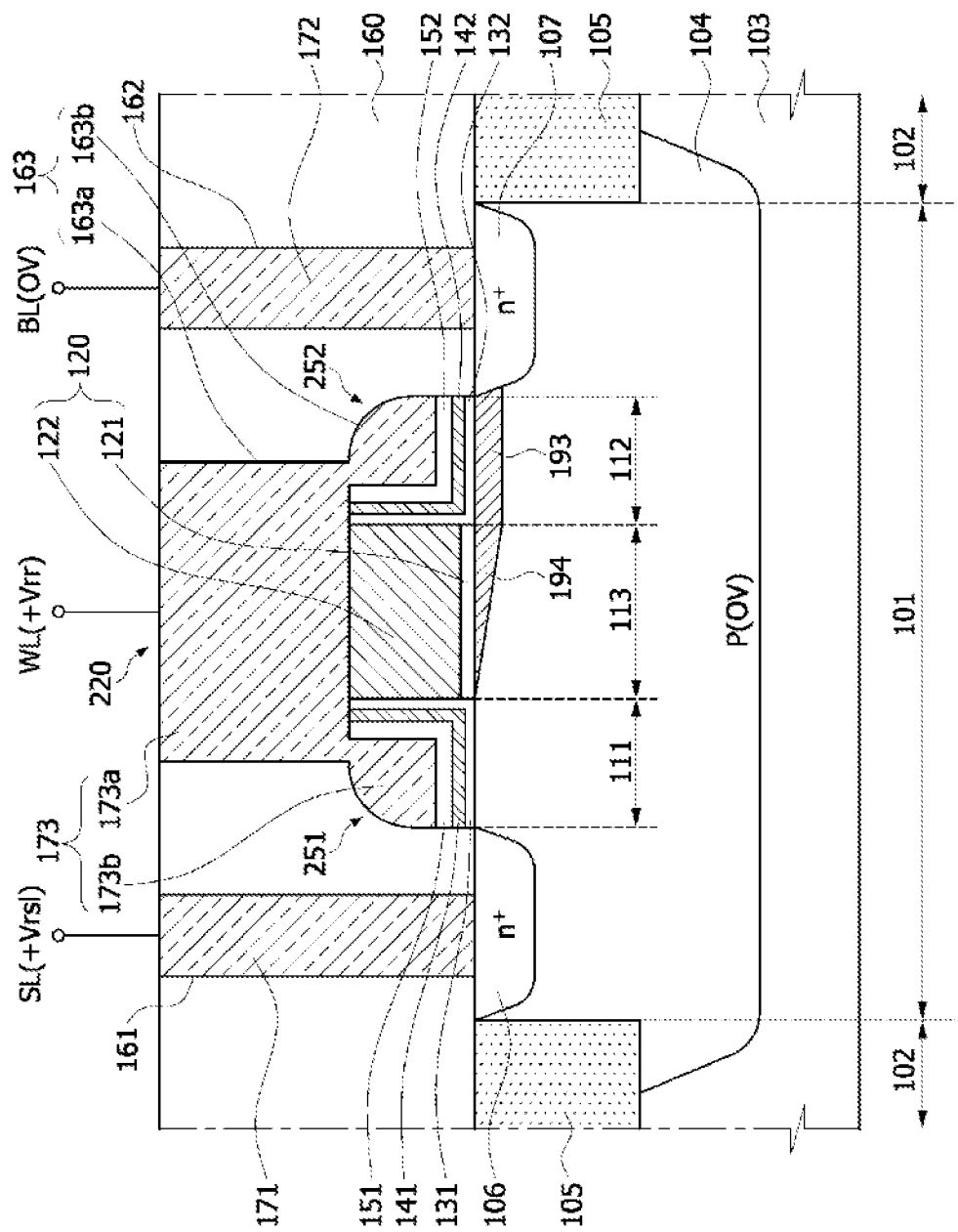
FIG. 9 is a cross-sectional view illustrating a read operation of the second charge storage transistor of the charge trapping nonvolatile memory device shown in FIG. 1.

FIG. 9 is a cross-sectional view illustrating a read operation of the second charge storage transistor 252 of the charge trapping nonvolatile memory device shown in FIG. 1. In FIG. 9, the same reference numerals as used in FIGS. 1 and 2 denote the same elements. Referring to FIG. 9, in order to read out data stored in the second charge storage transistor 252, the positive read voltage +Vrr may be applied to the word line WL and a positive read source line voltage +Vrsl may be applied to the source line SL. The bit line BL and the well region 104 may be grounded.

The positive read voltage +Vrr may be higher than a threshold voltage of the selection transistor 220. In addition, the positive read voltage +Vrr may have an inter-level between a threshold voltage of the second charge storage transistor 252 in an erased state and a threshold voltage of the second charge storage transistor 252 in a programmed state. In some embodiments, the positive read source line voltage +Vrsl may have a sufficient voltage level to completely deplete the first trapping region 111.

The positive read voltage +Vrr may be applied to the third contact plug 173 and the gate conductive pattern 122 through the word line WL. Accordingly, the selection transistor 220 may be turned on such that an inversion layer is formed in the channel region 113. An inversion layer may be formed in the second trapping region 112 if the second charge storage transistor 252 is in an erased state, but no inversion layer may be formed in the second trapping region 112 if the second charge storage transistor 252 is in a programmed state.

The read operation of the second charge storage transistor 252 in an erased state will be described hereinafter. Specifically, the second charge storage transistor 252 and the selection transistor 220 may be turned on such that a third inversion layer 193 and a fourth inversion layer 194 are formed in the second trapping region 112 and the channel region 113, respectively. The third and fourth inversion layers 193 and 194 may serve as current paths through which carriers move.

Since the positive read source line voltage +Vrsl is applied to the source region 106 through the source line SL, the first trapping region 111 may be fully depleted by a surface punch-through phenomenon and serve as an extension of the source region 106. Thus, electrons may be drifted from the drain region 107 to the source region 106 by a voltage difference between the source region 106 and the drain region 107. That is, a channel current may flow from the source region 106 to the drain region 107. Accordingly, a sense amplifier (not shown) connected to the source line SL may sense the channel current. This indicates that the second charge storage transistor 252 is in an erased state.

A read operation of the second charge storage transistor 252 in a programmed state will be described hereinafter. Specifically, while the selection transistor 220 is turned on, the second charge storage transistor 252 may be turned off. Thus, the fourth inversion layer 194 is formed in the channel region 113, but the third inversion layer 193 may not be formed in the second trapping region 112.

Since the positive read source line voltage +Vrsl is applied to the source region 106 through the source line SL, the first trapping region 111 may be fully depleted by a surface punch-through phenomenon and serve as an extension of the source region 106. However, since no inversion layer is formed in the second trapping region 112, no channel current may flows between the source region 106 and the drain region 107 even though a voltage difference exists between the source region 106 and the drain region 107. This indicates that the second charge storage transistor 252 is in a programmed state.

Figure 10:
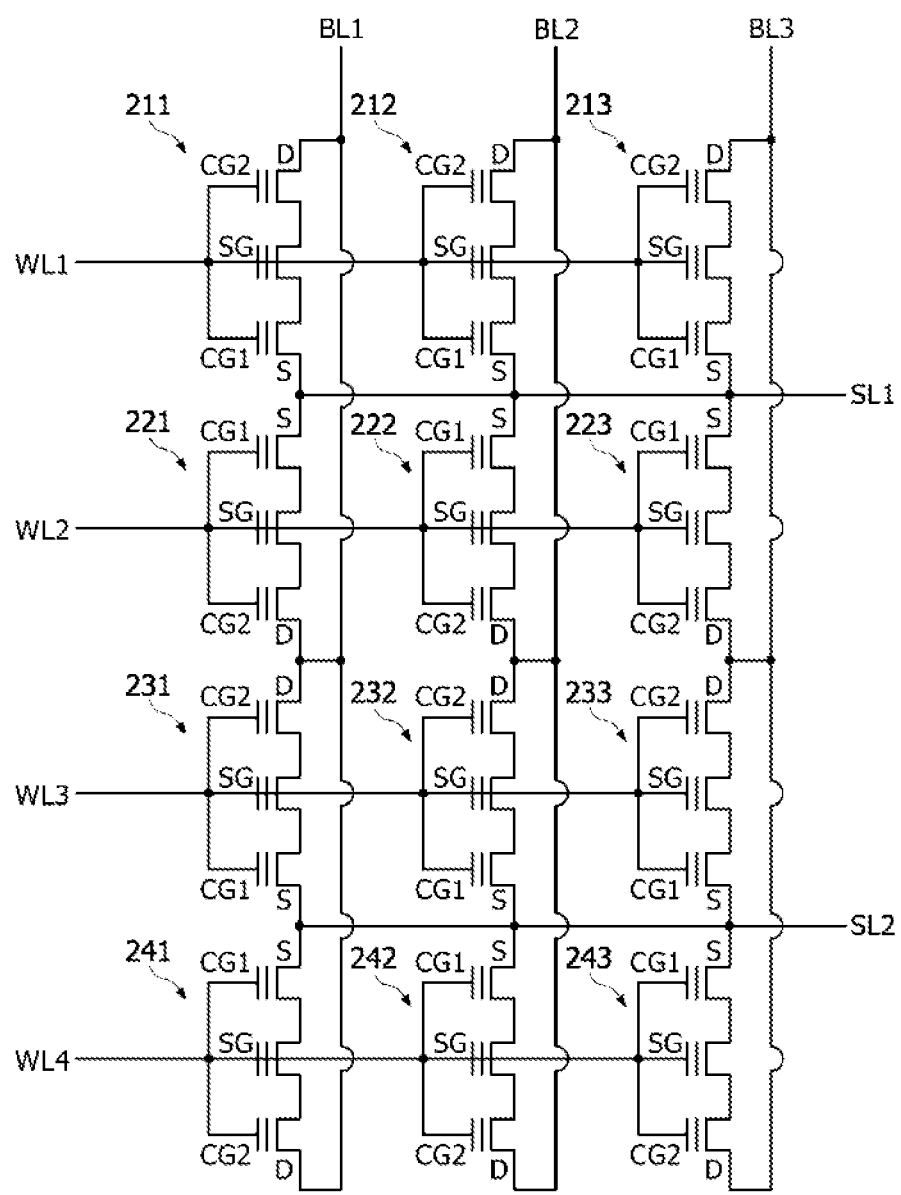
FIG. 10 is an equivalent circuit diagram illustrating a cell array of a charge trapping nonvolatile memory device according to an embodiment.

FIG. 10 is an equivalent circuit diagram illustrating a cell array 200 of a charge trapping nonvolatile memory device according to an embodiment. Referring to FIG. 10, the cell array 200 may include a plurality of unit cells which are arrayed in rows and columns to have a "4×3" matrix form. The number of the rows and the number of the columns of the cell array 200 may vary according to the embodiments. Even though the number of the rows and the number of the columns are different, the same configuration and operation may be equally applicable to those embodiments.

Each of the unit cells included in the cell array 200 may have the same configuration as the charge trapping nonvolatile memory device shown in FIGS. 1 and 2. That is, each unit cell of the cell array 200 may be configured to include a first charge storage transistor having the first control gate terminal CG1, a selection transistor having the selection gate terminal SG, and a second charge storage transistor having the second control gate terminal CG2 which are connected in series. Accordingly, descriptions of the same elements as set forth in the previous embodiments will be omitted or briefly mentioned hereinafter to avoid duplicate explanation.

The unit cells of the cell array 200 may be located at cross points of the rows and the columns, respectively. Although not shown in the drawings, all of the unit cells constituting the cell array 200 shown in FIG. 10 may be disposed on a single well region. A common well bias voltage may be applied to the single well region.

The unit cells included in each of three columns may be connected to each other in series. A source terminal S of a first unit cell located at an $N^{th}$ row where N is an odd integer, and a $P^{th}$ column where P is an integer, may be directly connected to a source terminal S of a second unit cell located at a cross point of the $(N+1)^{th}$ row and $P^{th}$ column. That is, a pair of adjacent unit cells, which are respectively located at the $N^{th}$ row and the $(N+1)^{th}$ row in the same column, may share a single source terminal with each other.

For example, a source terminal S of a unit cell 211 located at a cross point of a first row and a first column may be directly connected to a source terminal S of a unit cell 221 located at a cross point of a second row and the first column. In addition, a source terminal S of a unit cell 231 located at a cross point of a third row and a first column may be directly connected to a source terminal S of a unit cell 241 located at a cross point of a fourth row and the first column.

A drain terminal D of a third unit cell located at a cross point of an $M^{th}$ row where M is an even integer, and a $Q^{th}$ column where Q is an integer, may be directly connected to a drain terminal D of a fourth unit cell located at a cross point of the $(M+1)^{th}$ row and the $Q^{th}$ column. That is, a pair of adjacent unit cells respectively located at the $M^{th}$ row and the $(M+1)^{th}$ row and commonly connected to the same column may share a single drain terminal with each other.

For example, a drain terminal D of the unit cell 221 located at a cross point of the second row and the first column may be directly connected to a drain terminal D of the unit cell 231 located at a cross point of the third row and the first column.

Selection gate terminals SG of the unit cells arrayed in the same row may be commonly connected to a single word line. For example, the selection gate terminals SG of the unit cells 211, 212 and 213 arrayed in the first row may be commonly connected to a first word line WL1. Likewise, the selection gate terminals SG of the unit cells 221, 222 and 223 arrayed in the second row may be commonly connected to a second word line WL2. The selection gate terminals SG of the unit cells 231, 232 and 233 arrayed in the third row may be commonly connected to a third word line WL3. The selection gate terminals SG of the unit cells 241, 242 and 243 arrayed in the fourth row may be commonly connected to a fourth word line WL4.

The drain terminals D of the unit cells arrayed in the same column may be commonly connected to a single bit line. For example, the drain terminals D of the unit cells 211, 221, 231 and 241 arrayed in the first column may be commonly connected to a first bit line BL1. Likewise, the drain terminals D of the unit cells 212, 222, 232 and 242 arrayed in the second column may be commonly connected to a second bit line BL2. The drain terminals D of the unit cells 213, 223, 233 and 243 arrayed in the third column may be commonly connected to a third bit line BL3 in common.

The source terminals S of the unit cells arrayed in the $N^{th}$ row and the $(N+1)^{th}$ row may be commonly connected to a single source line. For example, the source terminals S of the unit cells 211, 212, 213, 221, 222 and 223 arrayed in the first and second rows may be commonly connected to a first source line SL1. In addition, the source terminals S of the unit cells 231, 232, 233, 241, 242 and 243 arrayed in the third and fourth rows may be commonly connected to a second source line SL2.

Figure 11:
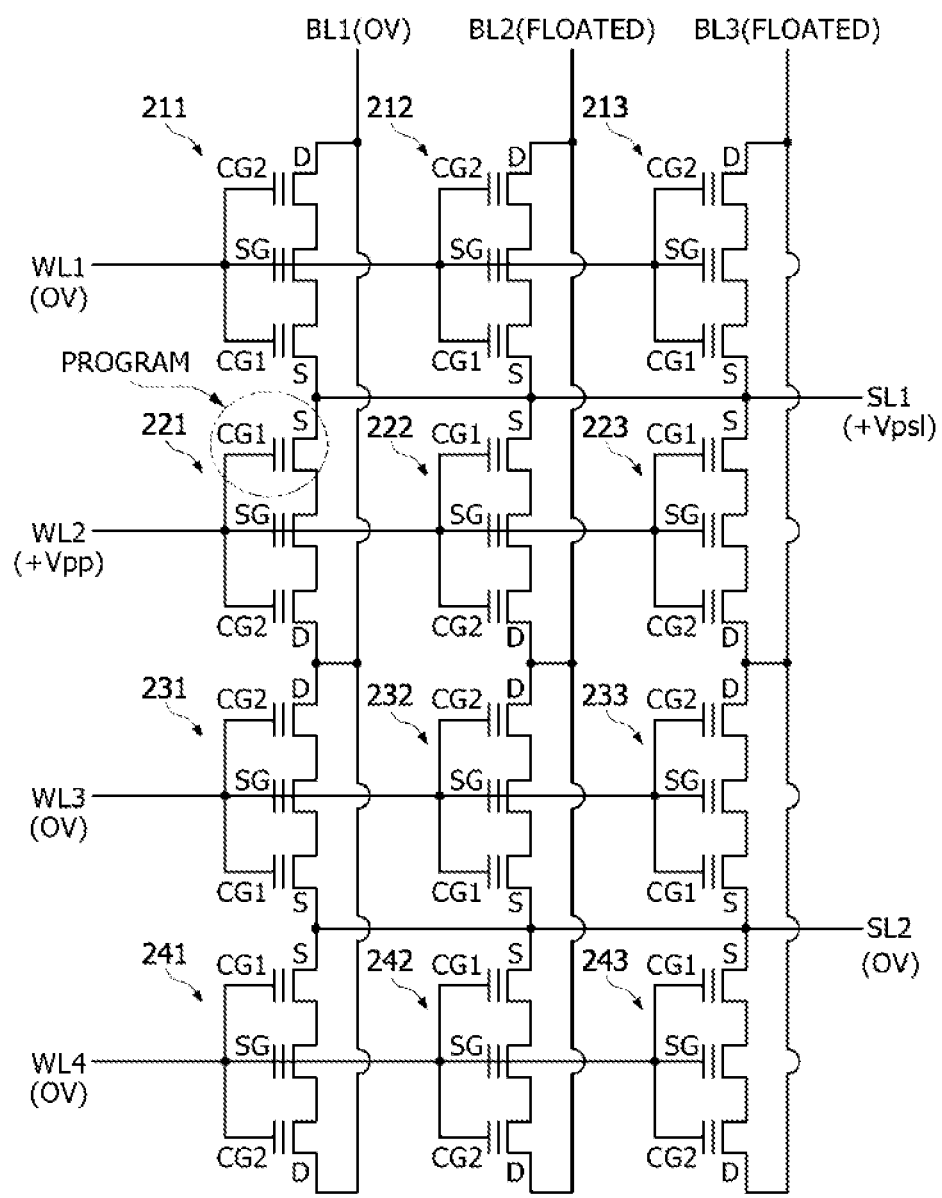
FIG. 11 is an equivalent circuit diagram illustrating a program operation of the cell array of the charge trapping nonvolatile memory device shown in FIG. 10.

FIG. 11 is an equivalent circuit diagram illustrating a program operation of the cell array 200 of the charge trapping nonvolatile memory device shown in FIG. 10. In FIG. 11, the first charge storage transistor of the unit cell 221 hereinafter, referred to as a selected unit cell, located at a cross point of the second row and the first column is programmed, for example. (See the dotted circle in FIG. 11). The present embodiment may be applied for programming another first charge storage transistor in another unit cell.

Referring to FIG. 11, a positive program voltage +Vpp may be applied to the second word line WL2 connected to the selection gate SG of the selected unit cell 221, and the remaining word lines WL1, WL3 and WL4 may be grounded. A positive program source line voltage +Vpsl may be applied to the first source line SL1 connected to the source terminal S of the selected unit cell 221. The remaining source line SL2 may be grounded. The first bit line BL1 connected to the drain region D of the selected unit cell 221 may be grounded. The remaining bit lines BL2 and BL3 may be floated. Although not shown in FIG. 11, the well region on which the cell array is disposed may be grounded.

Under the above bias condition, the first charge storage transistor of the selected unit cell 221 may be programmed by a channel hot carrier injection mechanism described above with reference to FIG. 3. While the first charge storage transistor of the selected unit cell 221 is programmed, the second and third bit lines BL2 and BL3 may be floated. Thus, no horizontal electric field may be created between the source terminal S and the drain terminal D of each of the non-selected unit cells, that is, the unit cells 222 and 223 located at cross points of the second row and the second and third columns, sharing the second word line WL2 with the selected unit cell 221. As a result, a program inhibition condition may be applied to the unit cells 222 and 223.

While the first charge storage transistor of the selected unit cell 221 is programmed, the second and third bit lines BL2 and BL3 may be floated. Thus, no horizontal electric field may be created between the source terminal S and the drain terminal D of each of the non-selected unit cells, that is, the unit cells 222 and 223 located at cross points of the second row and the second and third columns, sharing the second word line WL2 with the selected unit cell 221. As a result, a program inhibition condition may be applied to the unit cells 222 and 223.

While the first charge storage transistor of the selected unit cell 221 is programmed, the first word line WL1 may be grounded. Thus, all of the selection transistors of the non-selected unit cells, that is, the unit cells 211, 212 and 213 located at cross points of the first row and the first, second and third columns, sharing the first source line SL1 with the selected unit cell 221 may be turned off. As a result, a program inhibition condition may also be applied to the unit cells 211, 212 and 213. Similarly, a program inhibition condition may also be applied to all unit cells 231, 232, 233, 241, 242 and 243 connected to the third and fourth word lines WL3 and WL4 since the third and fourth word lines WL3 and WL4 are grounded.

Figure 12:
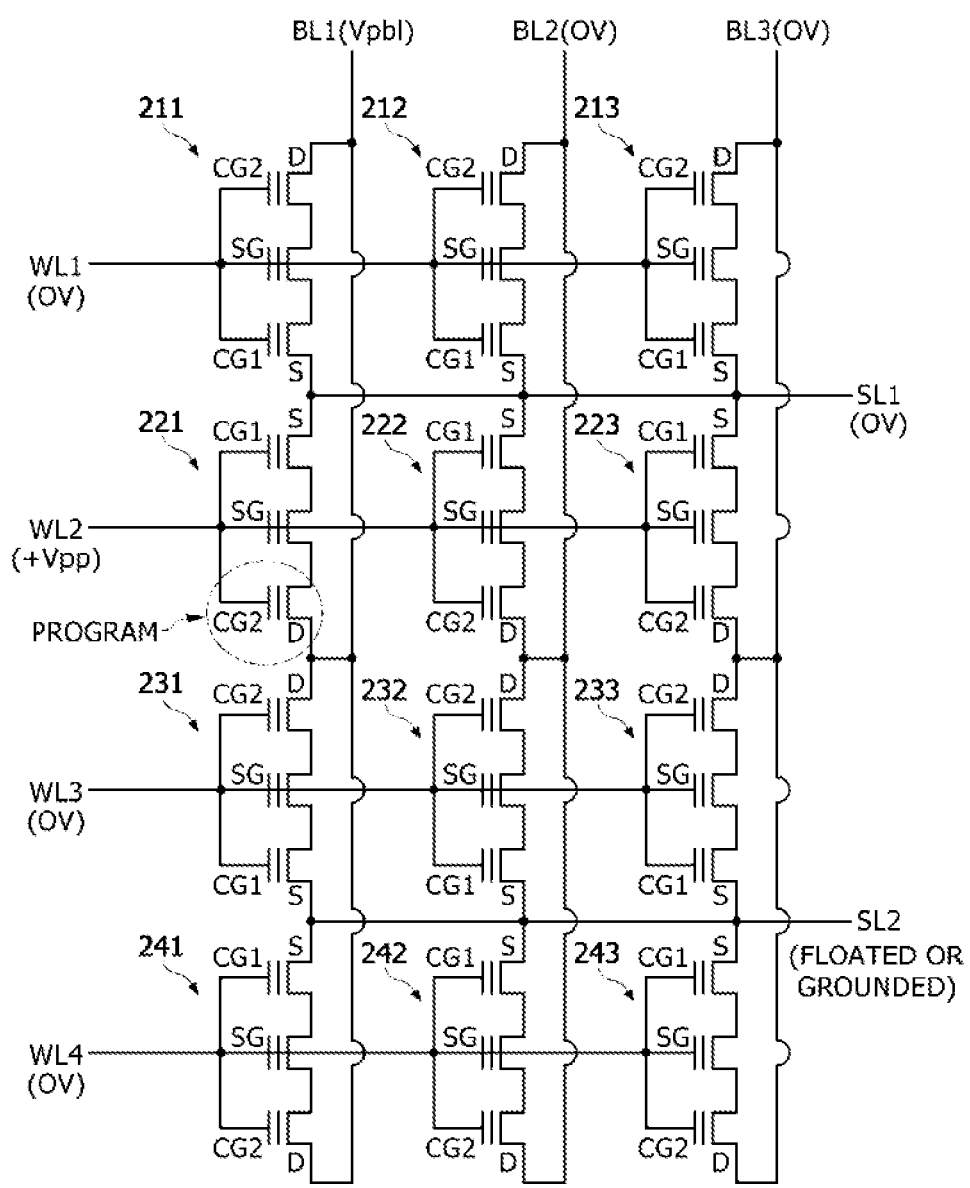
FIG. 12 is an equivalent circuit diagram illustrating another program operation of the cell array of the charge trapping nonvolatile memory device shown in FIG. 10.

FIG. 12 is an equivalent circuit diagram illustrating another program operation of the cell array 200 of the charge trapping nonvolatile memory device shown in FIG. 10. In FIG. 12, the second charge storage transistor of the unit cell 221 hereinafter, referred to as a selected unit cell, located at a cross point of the second row and the first column will be programmed. (See the dotted circle in FIG. 12). The present embodiment may be applied for programming another second charge storage transistor of another unit cell.

Referring to FIG. 12, a positive program voltage +Vpp may be applied to the second word line WL2 connected to the selection gate SG of the selected unit cell 221, and the remaining word lines WL1, WL3 and WL4 may be grounded. A positive program bit line voltage +Vpbl may be applied to the first bit line BL1 connected to the drain terminal D of the selected unit cell 221. The remaining bit lines BL2 and BL3 may be grounded. The first source line SL1 connected to the source region S of the selected unit cell 221 may be grounded. The remaining source line SL2 may be floated or grounded. Although not shown in FIG. 12, the well region on which the cell array is disposed may be grounded.

Under the above bias condition, the second charge storage transistor of the selected unit cell 221 may be programmed by a channel hot carrier injection mechanism described with reference to FIG. 4. While the second charge storage transistor of the selected unit cell 221 is programmed, the first, third and fourth word lines WL1, WL3 and WL4 may be grounded. Thus, the non-selected unit cells that is, the unit cells 211-213, 231-233 and 241-243 connected to the first, third and fourth word lines WL1, WL3 and WL4 which are grounded may not be programmed regardless of a bias condition applied to the bit lines BL1-BL3 and the source lines SL1 and SL2. While the second charge storage transistor of the selected unit cell 221 is programmed, the second and third bit lines BL2 and BL3 may be grounded. Thus, no horizontal electric field may be created between the source terminal S and the drain terminal D of each of the non-selected unit cells, that is, the unit cells 222 and 223 located at cross points of the second row and the second and third columns, sharing the second word line WL2 and the first source line SL1 with the selected unit cell 221. As a result, a program inhibition condition may be applied to the unit cells 222 and 223.

Figure 13:
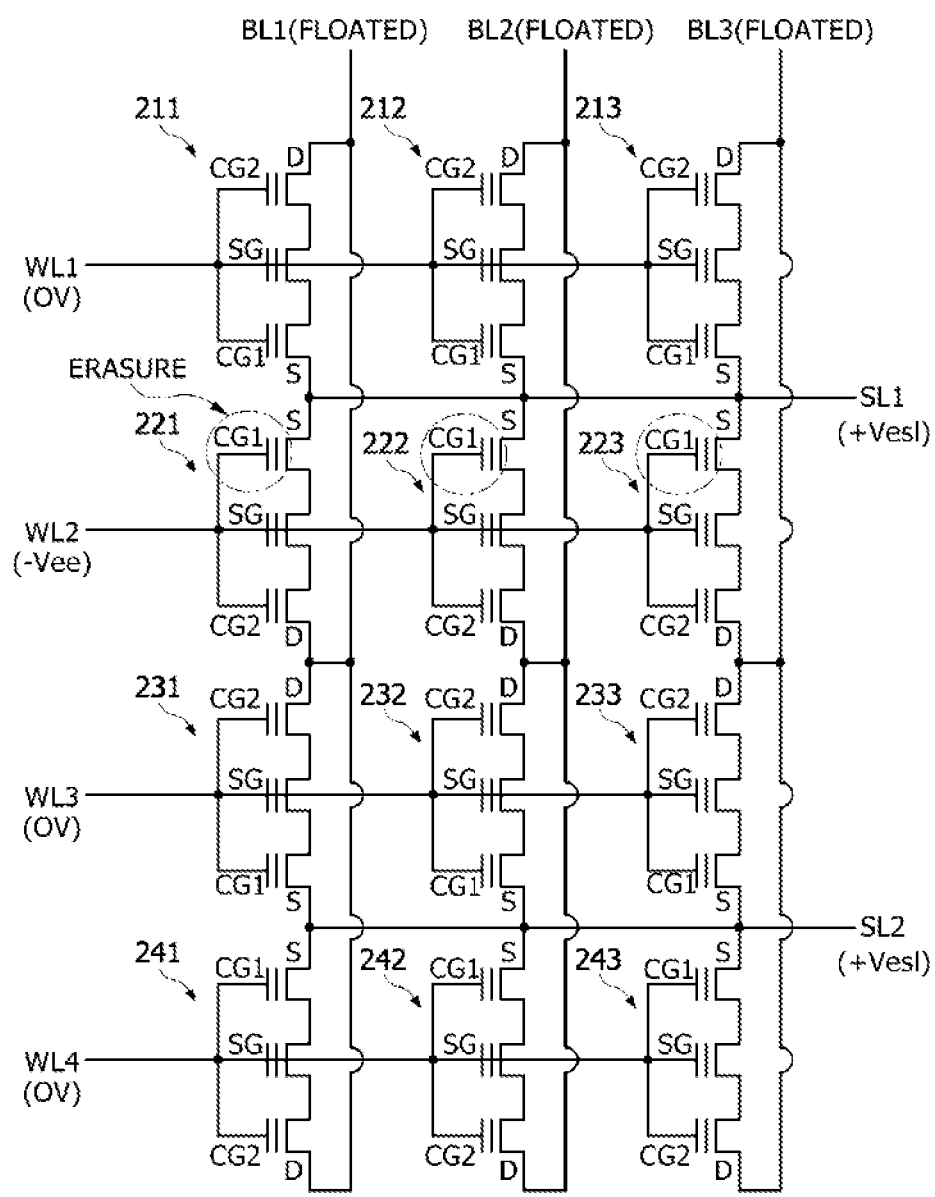
FIG. 13 is an equivalent circuit diagram illustrating a selective erasure operation of the cell array of the charge trapping nonvolatile memory device shown in FIG. 10.

FIG. 13 is an equivalent circuit diagram illustrating a selective erasure operation of the cell array 200 of the charge trapping nonvolatile memory device shown in FIG. 10. According to an embodiment, the first charge storage transistors connected to each of the first to fourth word lines WL1-WL4 may be formed in a first page, and the second charge storage transistors connected to each of the first to fourth word lines WL1-WL4 may be formed in a second page different from the first page. That is, two pages may be connected to each of the first to fourth word lines WL1-WL4.

The selective erasure operation of the first charge storage transistors which are included in the first page and connected to the second word line WL2 will be described. (See the dotted circles in FIG. 13).

The erasure operation is executed by unit of page. Referring to FIG. 13, a negative erasure voltage −Vee may be selectively applied to the second word line WL2, and the remaining word lines WL1, WL3 and WL4 may be grounded. In addition, a positive erasure source line voltage +Vesl may be applied to all of the source lines SL1 and SL2, and all of the bit lines BL1-BL3 may be floated. Although not shown in FIG. 13, the well region on which the cell array is disposed may be grounded.

Under the above bias condition, a voltage difference between the negative erasure voltage −Vee and the positive erasure source line voltage +Vesl may exist between the source terminal S and the first control gate terminal CG1 of each of the unit cells connected to the second word line WL2. Data stored in the first charge storage transistors connected to the second word line WL2 may be selectively erased by a BTBT mechanism due to the voltage difference between the negative erasure voltage −Vee and the positive erasure source line voltage +Vesl. While all of the first charge storage transistors connected to the second word line WL2 are erased, all of the second charge storage transistors may not be erased since all of the drain terminals D of the unit cells are electrically floated.

Figure 14:
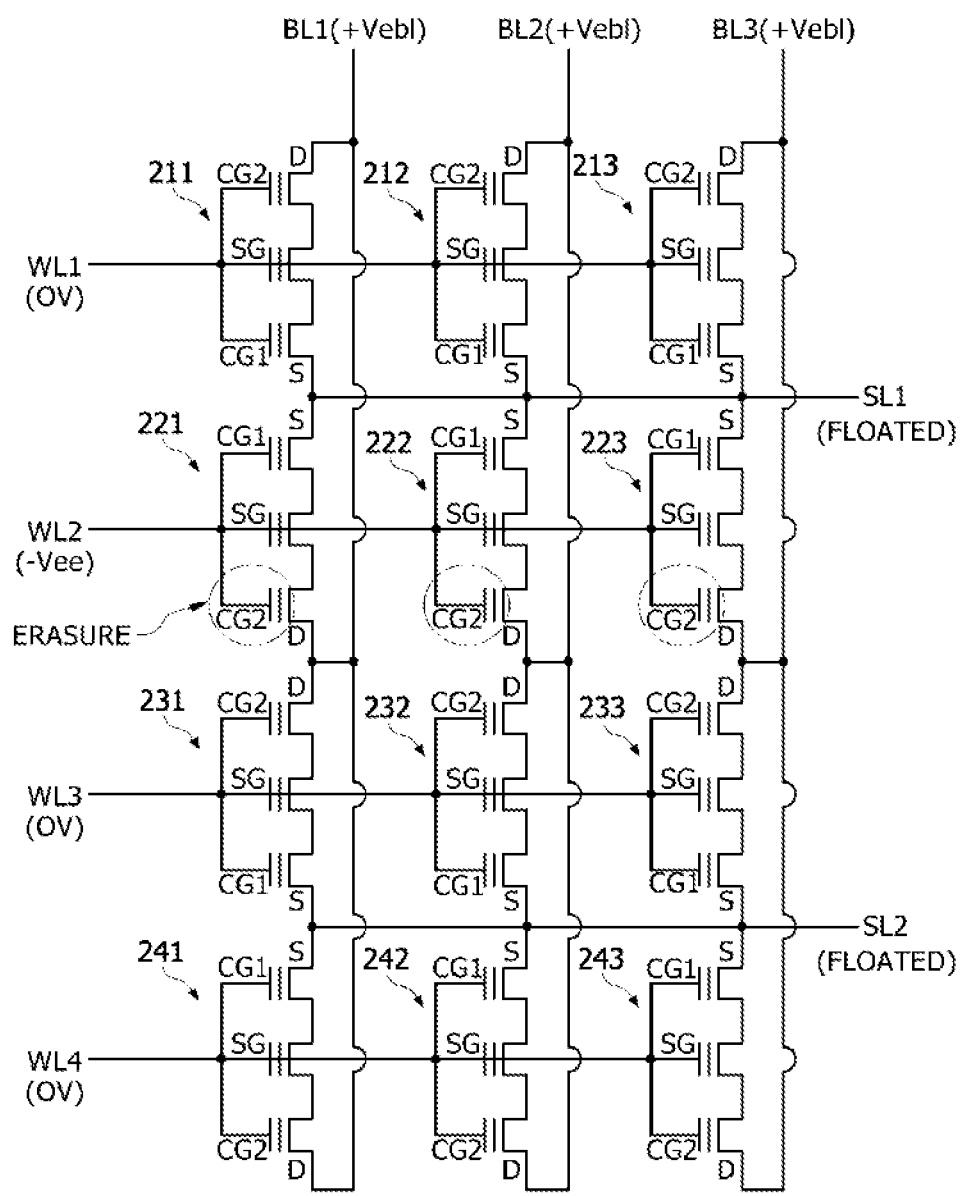
FIG. 14 is an equivalent circuit diagram illustrating another selective erasure operation of the cell array of the charge trapping nonvolatile memory device shown in FIG. 10.

FIG. 14 is an equivalent circuit diagram illustrating another selective erasure operation of the cell array 200 of the charge trapping nonvolatile memory device shown in FIG. 10. The selective erasure operation selectively erases only data stored in the second charge storage transistors which are included in the second page and connected to the second word line WL2. (See the dotted circles in FIG. 14).

Referring to FIG. 14, a negative erasure voltage −Vee may be selectively applied to the second word line WL2, and the remaining word lines WL1, WL3 and WL4 may be grounded. In addition, a positive erasure bit line voltage +Vebl may be applied to all of the bit lines BL1-BL3, and all of the source lines SL1 and SL2 may be floated. Although not shown in FIG. 14, the well region on which the cell array is disposed may be grounded.

Under the above bias condition, a voltage difference between the negative erasure voltage −Vee and the positive erasure bit line voltage +Vebl may exist between the drain terminal D and the second control gate terminal CG2 of each of the unit cells connected to the second word line WL2. Data stored in the second charge storage transistors connected to the second word line WL2 may be selectively erased by a BTBT mechanism due to the voltage difference between the negative erasure voltage −Vee and the positive erasure bit line voltage +Vebl. While all of the second charge storage transistors connected to the second word line WL2 are selectively erased, all of the first charge storage transistors may not be erased since all of the source terminals S of the unit cells are electrically floated.

Figure 15:
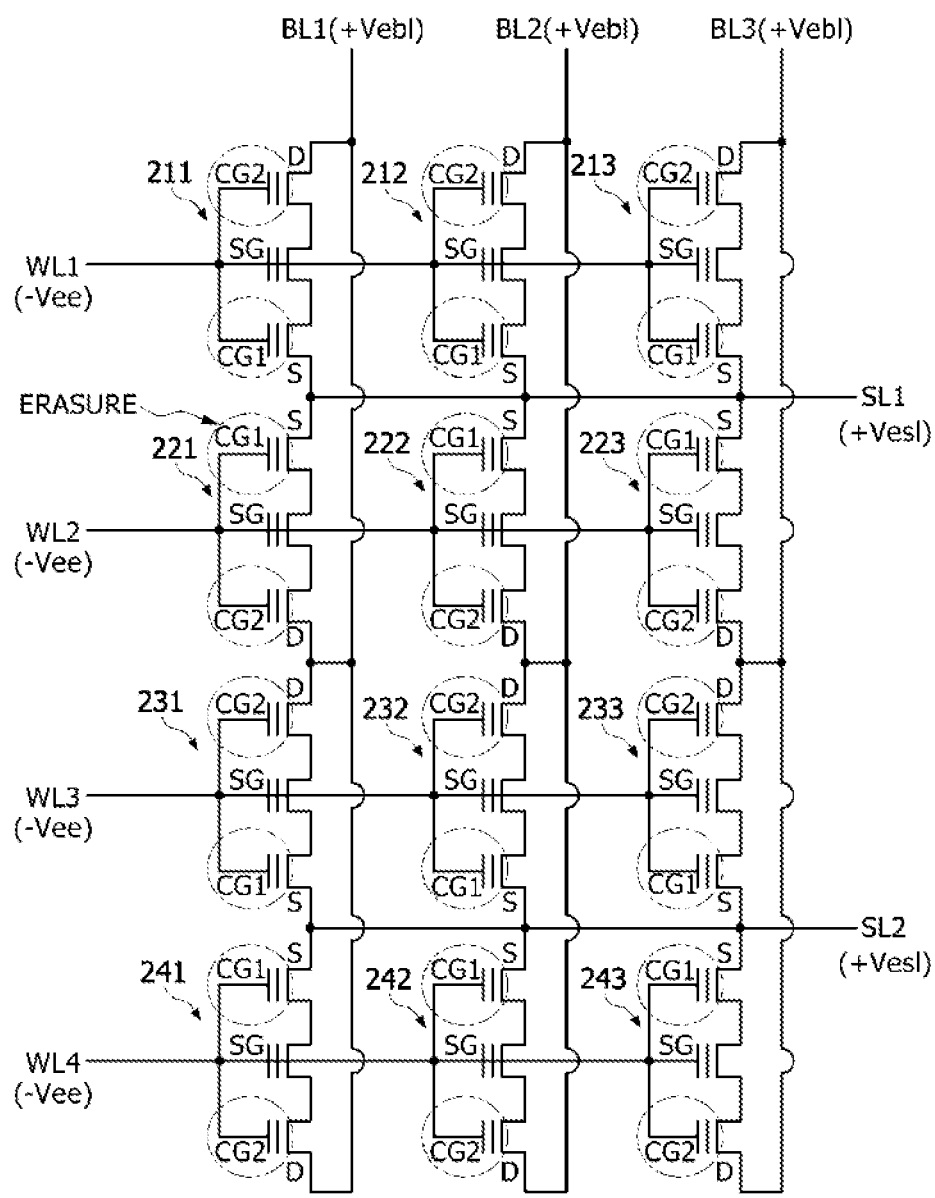
FIG. 15 is an equivalent circuit diagram illustrating a bulk erasure operation of the cell array of the charge trapping nonvolatile memory device shown in FIG. 10.

FIG. 15 is an equivalent circuit diagram illustrating a bulk erasure operation of the cell array 200 of the charge trapping nonvolatile memory device shown in FIG. 10. The bulk erasure operation simultaneously erases data stored in all of the unit cells, that is, all unit cells of the first and second charge storage transistors. See the dotted circles in FIG. 15.

The erasure operation may be executed by unit of block regardless of configuration of a page buffer circuit. Referring to FIG. 15, a negative erasure voltage −Vee may be applied to all of the word lines WL1-W124. In addition, a positive erasure source line voltage +Vesl may be applied to all of the source lines SL1 and SL2. A positive erasure bit line voltage +Vebl may be applied to all of the bit lines BL1-BL3. Although not shown in FIG. 15, a ground voltage or a positive well erasure well voltage +Vew may be applied to the well region on which the cell array is disposed.

The positive erasure source line voltage +Vesl and the positive erasure bit line voltage +Vebl may have substantially the same voltage level. When the positive well erasure well voltage +Vew is applied to the well region, the positive well erasure well voltage +Vew may have substantially the same voltage level as the positive erasure source line voltage +Vesl and the positive erasure bit line voltage +Vebl.

If the ground voltage is applied to the well region, a voltage difference between the negative erasure voltage −Vee and the positive erasure source line voltage +Vesl or the positive erasure bit line voltage +Vebl may exist between the source terminal S and the first control gate terminal CG1 of each of the unit cells as well as between the drain terminal D and the second control gate terminal CG2 of each of the unit cells, as described above with reference to FIG. 6. In such a case, data stored in all of the first and second charge storage transistors may be erased by a BTBT mechanism due to the voltage difference between the negative erasure voltage −Vee and the positive erasure source line voltage +Vesl or the positive erasure bit line voltage +Vebl.

If the positive well erasure well voltage +Vew is applied to the well region, a voltage difference between the negative erasure voltage −Vee and the positive well erasure well voltage +Vew may exist between the well region and the first control gate terminal CG1 of each of the unit cells as well as between the well region and the second control gate terminal CG2 of each of the unit cells, as described above with reference to FIG. 7. In such a case, data stored in all of the first and second charge storage transistors may be erased by an F-N tunneling mechanism due to the voltage difference between the negative erasure voltage −Vee and the positive well erasure well voltage +Vew. In such case, all of the source lines SL1 and SL2 and all of the bit lines BL1-BL3 may be electrically floated.

Figure 16:
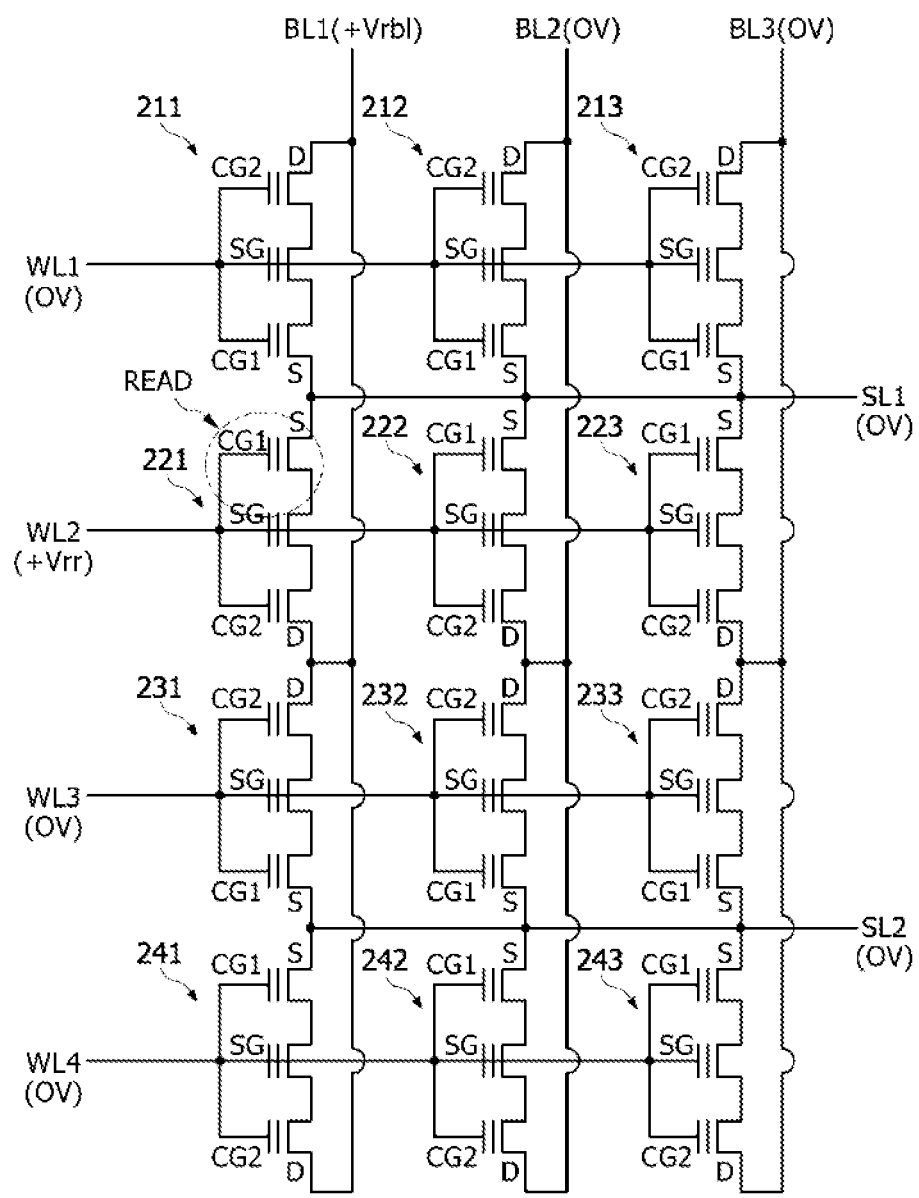
FIG. 16 is an equivalent circuit diagram illustrating a read operation of the cell array of the charge trapping nonvolatile memory device shown in FIG. 10.

FIG. 16 is an equivalent circuit diagram illustrating a read operation of the cell array 200 of the charge trapping nonvolatile memory device shown in FIG. 10. For example, a read operation reading out data stored in the first charge storage transistor of the unit cell 221 hereinafter, referred to as a selected unit cell, located at a cross point of the second row and the first column will be described below. See the dotted circle in FIG. 16. This read operation may be applied to reading out data stored in the first charge storage transistor of any one of the other unit cells.

Referring to FIG. 16, a positive read voltage +Vrr may be applied to the second word line WL2 connected to the selection gate terminal SG of the selected unit cell 221, and the remaining word lines WL1, WL3 and WL4 may be grounded. In addition, a positive read bit line voltage +Vrbl may be applied to the first bit line BL1 connected to the drain terminal D of the selected unit cell 221, and the remaining bit lines BL2 and BL3 may be grounded. Moreover, all of the source lines SL1 and SL2 may be grounded. Although not shown in FIG. 16, the well region may also be grounded.

Under the above bias condition, the data stored in the first charge storage transistor of the selected unit cell 221 may be read out by the mechanism described above with reference to FIG. 8. In such a case, the read operation may be executed by sensing a current flowing through the selected unit cell 221 between the first source line SL1 and the first bit line BL1.

While the data stored in the first charge storage transistor of the selected unit cell 221 is read out, the selection transistors of the non-selected unit cells, that is, the unit cells 211, 231 and 241, sharing the first bit line BL1 with the selected unit cell 221 may be turned off. This is due to the word lines WL1, WL3 and WL4 being grounded. Thus, the non-selected unit cells 211, 231 and 241 may not have influence on a current flowing through the first bit line BL1.

In addition, while the data stored in the first charge storage transistor of the selected unit cell 221 is read out, the non-selected unit cells 222 and 223 sharing the first source line SL1 and the second word line WL2 with the selected unit cell 221 may not have influence on a current flowing through the first source line SL1. This is due to no voltage difference existing between the source terminal S and the drain terminal D of each of the non-selected unit cells 222 and 223.

Moreover, while the data stored in the first charge storage transistor of the selected unit cell 221 is read out, the data stored in the non-selected unit cells 212, 213, 232, 233, 242 and 243 located at cross points of the grounded word lines WL1, WL3 and WL4 and the grounded bit lines BL2 and BL3 may not be read out. This is due to all of the selection transistors of the non-selected unit cells 212, 213, 232, 233, 242 and 243 being turned off.

Figure 17:
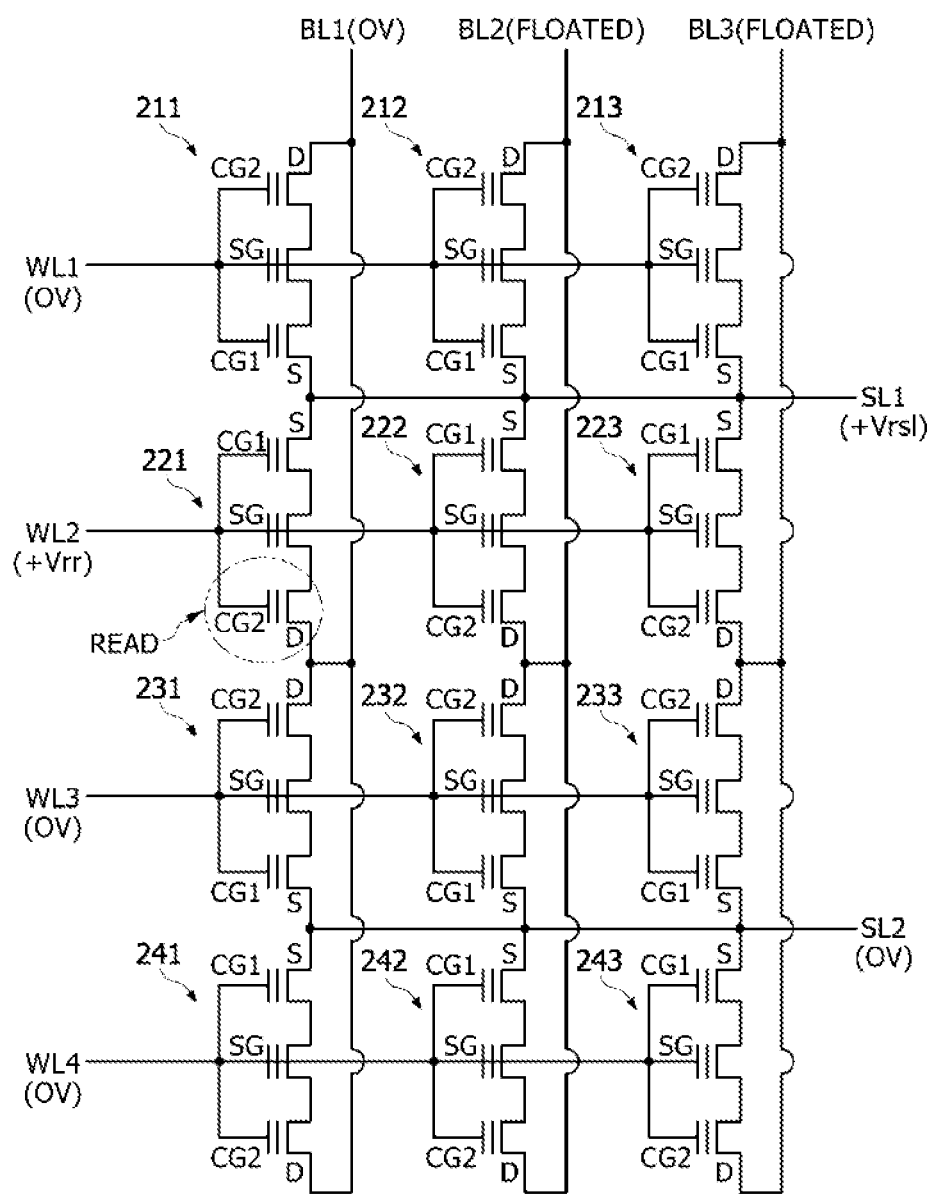
FIG. 17 is an equivalent circuit diagram illustrating another read operation of the cell array of the charge trapping nonvolatile memory device shown in FIG. 10.

FIG. 17 is an equivalent circuit diagram illustrating another read operation of the cell array 200 of the charge trapping nonvolatile memory device shown in FIG. 10. For example, a read operation reading out data stored in the second charge storage transistor of the unit cell 221 hereinafter, referred to as a selected unit cell, located at a cross point of the second row and the first column will be described below. See the dotted circle in FIG. 17.

This read operation may be applied to reading out data stored in the second charge storage transistor of any one of the other unit cells. Referring to FIG. 17, a positive read voltage +Vrr may be applied to the second word line WL2 connected to the selection gate terminal SG of the selected unit cell 221, and the remaining word lines WL1, WL3 and WL4 may be grounded. In addition, a positive read source line voltage +Vrsl may be applied to the first source line SL1 connected to the source terminal S of the selected unit cell 221, and the remaining source line SL2 may be grounded. Moreover, the first bit line BL1 connected to the drain terminal D of the selected unit cell 221 may be grounded, and the remaining bit lines BL2 and BL3 may be electrically floated. Although not shown in FIG. 17, the well region may be grounded.

Under the above bias condition, the data stored in the second charge storage transistor of the selected unit cell 221 may be read out by the mechanism described above with reference to FIG. 9. In such a case, the read operation may be executed by sensing a current flowing through the selected unit cell 221 between the first source line SL1 and the first bit line BL1.

While the data stored in the second charge storage transistor of the selected unit cell 221 is read out, the selection transistors of the non-selected unit cells, that is, the unit cells 211, 231 and 241, sharing the first bit line BL1 with the selected unit cell 221 may be turned off since the word lines WL1, WL3 and WL4 are grounded. Thus, the non-selected unit cells 211, 231 and 241 may not have influence on a current flowing through the first bit line BL1.

In addition, while the data stored in the second charge storage transistor of the selected unit cell 221 is read out, the non-selected unit cells 222 and 223 sharing the first source line SL1 and the second word line WL2 with the selected unit cell 221 may not have influence on a current flowing through the first source line SL1. This is due to the drain terminals D of the non-selected unit cells 222 and 223 being electrically floated.

Moreover, while the data stored in the second charge storage transistor of the selected unit cell 221 is read out, the data stored in the non-selected unit cells 212, 213, 232, 233, 242 and 243 located at cross points of the grounded word lines WL1, WL3 and WL4 and the floated bit lines BL2 and BL3 may not be read out. This is due to all of the selection transistors of the non-selected unit cells 212, 213, 232, 233, 242 and 243 being turned off.

Figure 18:
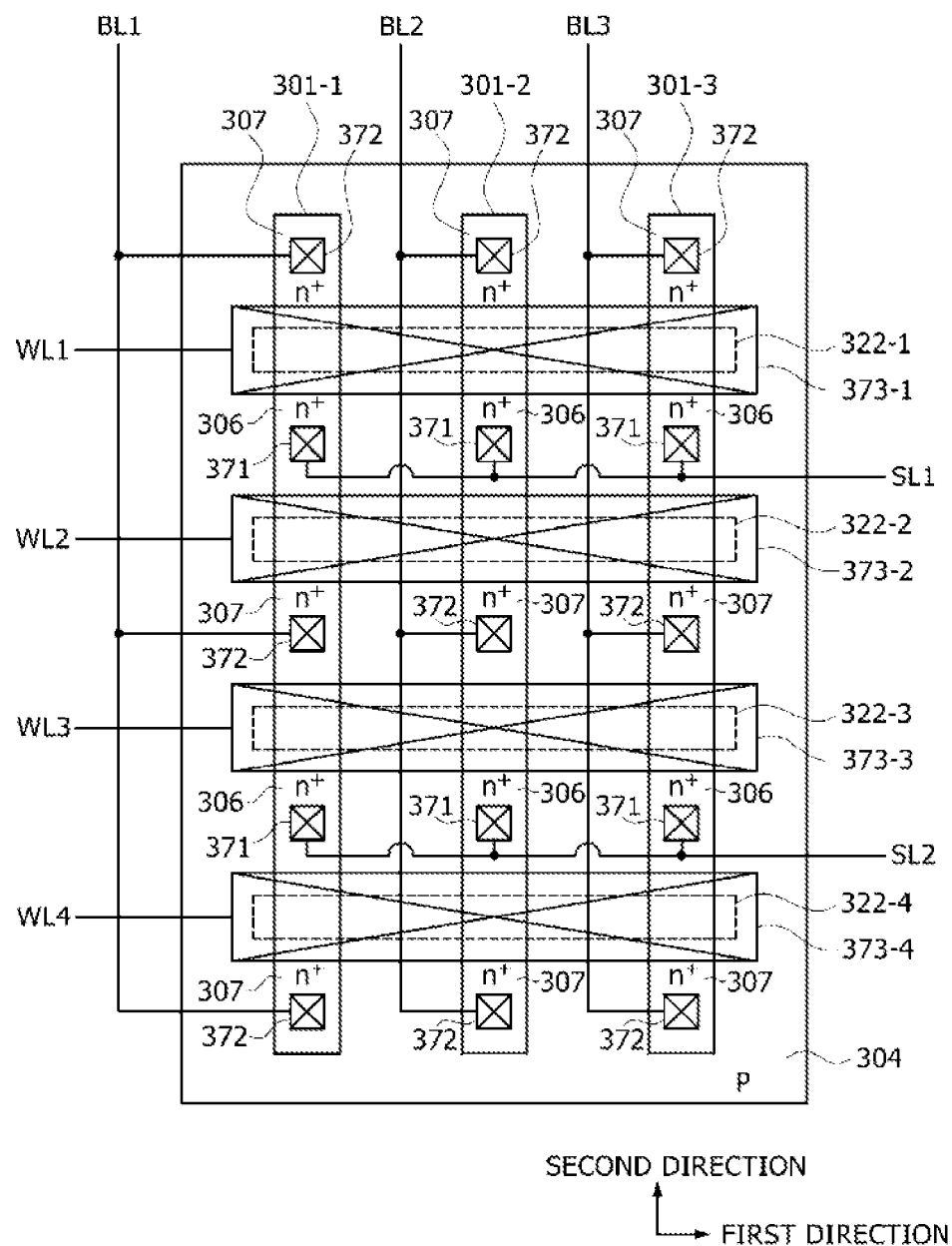
FIG. 18 is a layout diagram illustrating a cell array of a charge trapping nonvolatile memory device according to an embodiment.

FIG. 18 is a layout diagram illustrating a cell array of a charge trapping nonvolatile memory device according to an embodiment. The layout diagram illustrated in FIG. 18 may correspond to the equivalent circuit diagram of FIG. 10. Referring to FIG. 18, a plurality of active regions, for example, three active regions 301-1, 301-2 and 301-3 may be disposed in a well region 304. In some embodiments, the well region 304 may be P-type. The active regions 301-1, 301-2 and 301-3 may be spaced apart from each other in a first direction. For example, the first direction may be a horizontal direction.

Each of the active regions 301-1, 301-2 and 301-3 may extend in a second direction intersecting the first direction and having a stripe shape. For example, the second direction may be a vertical direction. A plurality of gate conductive patterns 322-1, 322-2, 322-3 and 322-4 may be disposed on the well region 304 and the active regions 301-1, 301-2 and 301-3, and may be electrically insulated from the well region 304 and the active regions 301-1, 301-2 and 301-3 by gate insulation patterns (not shown) which are disposed between the plurality of gate conductive patterns 322-1, 322-2, 322-3 and 322-4 and the active regions 301-1, 301-2 and 301-3.

The gate conductive patterns 322-1, 322-2, 322-3 and 322-4 may be spaced apart from each other in the second direction. Each of the gate conductive patterns 322-1, 322-2, 322-3 and 322-4 may extend in the first direction and have a stripe shape. Thus, the gate conductive patterns 322-1, 322-2, 322-3 and 322-4 may intersect the active regions 301-1, 301-2 and 301-3. As a result, unit cells may be respectively disposed at cross points of the gate conductive patterns 322-1, 322-2, 322-3 and 322-4 and the active regions 301-1, 301-2 and 301-3, to provide a cell array having a matrix form.

Third contact plugs 373-1, 373-2, 373-3 and 373-4 may be disposed on the gate conductive patterns 322-1, 322-2, 322-3 and 322-4, respectively. Each of the third contact plugs 373-1, 373-2, 373-3 and 373-4 may be disposed to fully overlap with any one of the gate conductive patterns 322-1, 322-2, 322-3 and 322-4. As described with reference to the cross-sectional view of FIG. 1, the third contact plugs 373-1, 373-2, 373-3 and 373-4 may be in direct contact with top surfaces of the gate conductive patterns 322-1, 322-2, 322-3 and 322-4, respectively.

In addition, each of the third contact plugs 373-1, 373-2, 373-3 and 373-4 may be laterally enlarged to cover sidewalls of one of the gate conductive patterns 322-1, 322-2, 322-3 and 322-4 and to extend onto top surfaces of the active regions 301-1, 301-2 and 301-3 adjacent to the corresponding gate conductive pattern 322-1, 322-2, 322-3 or 322-4. In such a case, a tunnel insulation layer, a charge trap layer, and a blocking insulation layer, which are sequentially stacked, may be disposed between the third contact plugs 373-1, 373-2, 373-3 and 373-4 and the active regions 301-1, 301-2 and 301-3. The tunnel insulation layer, the charge trap layer and the blocking insulation layer may upwardly extend to cover the sidewalls of the gate conductive patterns 322-1, 322-2, 322-3 and 322-4.

A drain region 307 and a source region 306 may be alternately arrayed in each active region 301-1, 301-2 or 301-3, which are uncovered by the third contact plugs 373-1, 373-2, 373-3 and 373-4. First contact plugs 371 may be respectively disposed on the source regions 306, and second contact plugs 372 may be respectively disposed on the drain regions 307. The second contact plugs 372 disposed on the active region 301-1 may be electrically connected to a first bit line BL1. The second contact plugs 372 disposed on the active region 301-2 may be electrically connected to a second bit line BL2. The second contact plugs 372 disposed on the active region 301-3 may be electrically connected to a third bit line BL3.

The first contact plugs 371 disposed between the third contact plugs 373-1 and 373-2 may be electrically connected to a first source line SL1. The first contact plugs 371 disposed between the third contact plugs 373-3 and 373-4 may be electrically connected to a second source line SL2. The third contact plugs 373-1, 373-2, 373-3 and 373-4 may be electrically connected to first, second, third and fourth word lines WL1, W12, WL3 and WL4, respectively.

Figure 19:
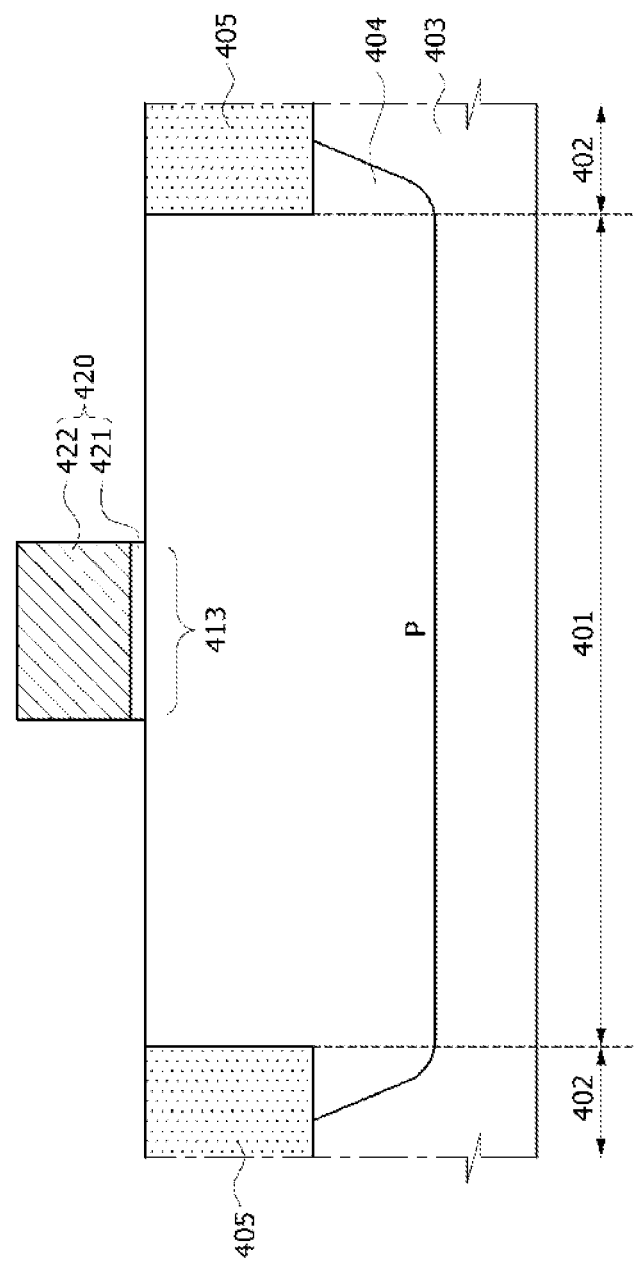
FIGS. 19 to 24 are cross-sectional views illustrating a method of fabricating a charge trapping nonvolatile memory device according to an embodiment.

FIGS. 19 to 24 are cross-sectional views illustrating a method of fabricating a charge trapping nonvolatile memory device according to an embodiment. Referring to FIG. 19, a P-type well region 404 may be formed in an upper portion of a substrate 403. A trench isolation layer 405 may be formed in an isolation region 402 of the substrate 403 to define an active region 401. If the substrate 403 is P-type, a process for forming the P-type well region 404 may be omitted. A gate stack structure 420 may be formed on the substrate 403 in the active region 401. The gate stack structure 420 may be formed to include a gate insulation pattern 421 and a gate conductive pattern 422 which are sequentially stacked. In some embodiments, the gate insulation pattern 421 may be formed of an oxide layer, and the gate conductive pattern 422 may be formed of a polysilicon layer. An upper region of the well region 404 overlapping with the gate stack structure 420 may correspond to a channel region 413.

Figure 20:
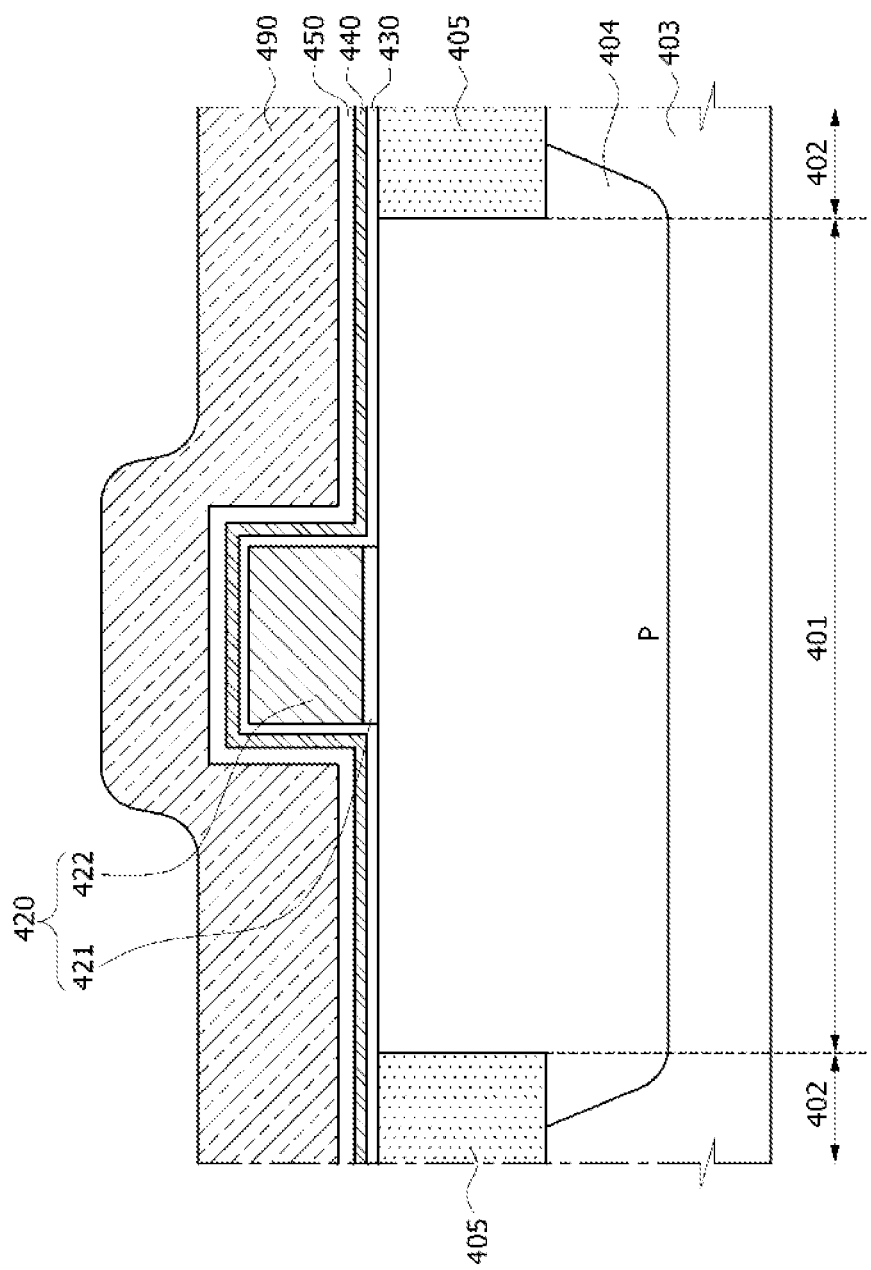

Referring to FIG. 20, a tunnel insulation layer 430, a charge trap layer 440, a blocking insulation layer 450 and a spacer insulation layer 490 may be sequentially formed on an entire surface of the substrate including the gate stack structure 420. The tunnel insulation layer 430 may be formed to include an oxide layer. The tunnel insulation layer 430 may be formed to be thinner than the gate insulation pattern 421. The charge trap layer 440 may be formed to include a nitride layer. The blocking insulation layer 450 may be formed of an oxide layer or a high-k dielectric layer such as an aluminum oxide layer. The spacer insulation layer 490 may be formed to include a nitride layer.

Although not shown in the drawings, if some elements such as MOS transistors are formed in other regions of the substrate 403. An ion implantation process for forming lightly doped drain (LDD) regions of the MOS transistors may be performed before forming the tunnel insulation layer 430, the charge trap layer 440, the blocking insulation layer 450 and the spacer insulation layer 490.

Figure 21:
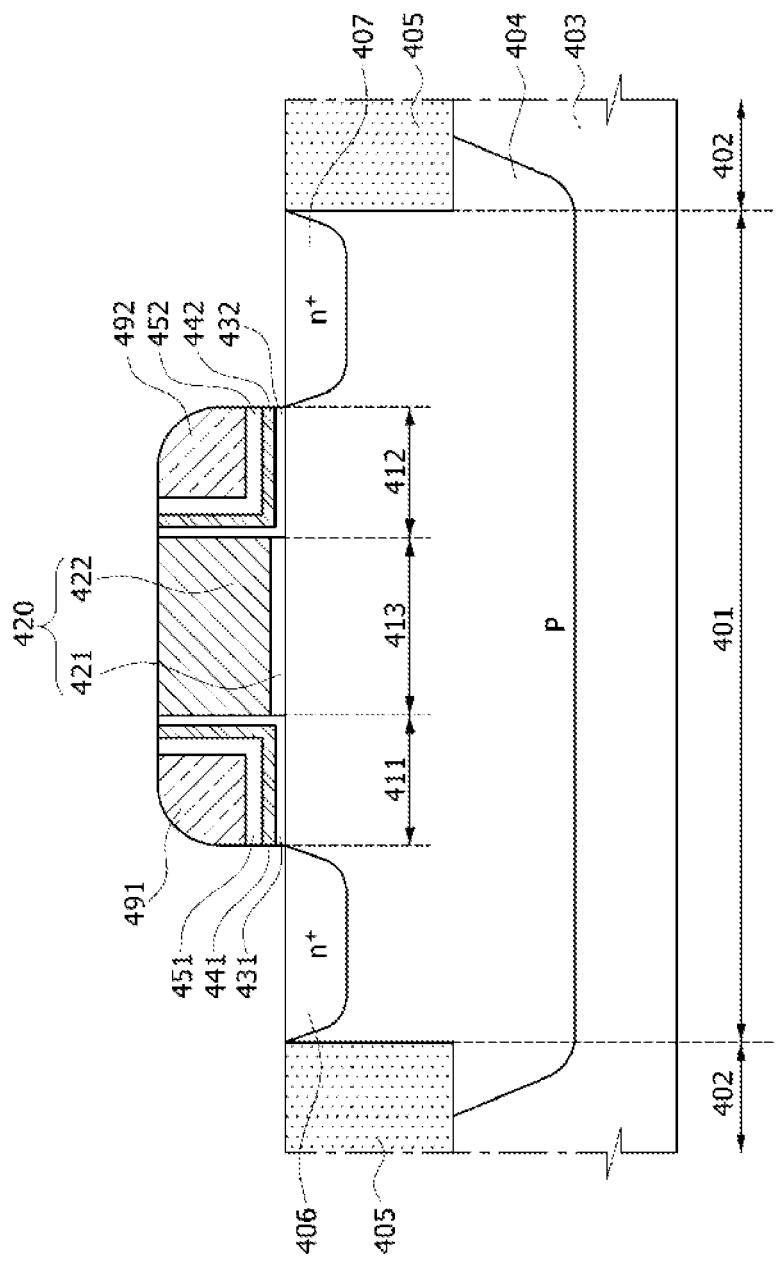

Referring to FIG. 21, the spacer insulation layer 490 may be anisotropically etched to form a first spacer 491 and a second spacer 492 on both sidewalls of the gate conductive pattern 422 respectively. While the spacer insulation layer 490 is anisotropically etched, the tunnel insulation layer 430, the charge trap layer 440, and the blocking insulation layer 450 on a top surface of the gate stack structure 420 and on a top surface of the substrate 403 may be removed. Thus, a first tunnel insulation layer 431, a first charge trap layer 441 and a first blocking insulation layer 451 may be formed between the first spacer 491 and the gate conductive pattern 422 as well as between the first spacer 491 and the substrate 403 that is, the P-type well region 404.

Moreover, a second tunnel insulation layer 432, a second charge trap layer, 442 and a second blocking insulation layer 452 may be formed between the second spacer 492 and the gate conductive pattern 422 as well as between the second spacer 492 and the substrate 403 that is, the P-type well region 404. The first tunnel insulation layer 431, the first charge trap layer 441, the first blocking insulation layer 451 and the first spacer 491 may constitute a first dummy spacer. Likewise, the second tunnel insulation layer 432, the second charge trap layer 442, the second blocking insulation layer 452 and the second spacer 492 may constitute a second dummy spacer.

Subsequently, using the gate stack structure 420 and the first and second spacers 491 and 492 as ion implantation masks, N-type impurity ions may be implanted into the well region 404 of the active region 401 to form an N-type source region 406 and an N-type drain region 407 at opposing sides of the gate stack structure 420, respectively. In such a case, the source region 406 and the drain region 407 may be substantially self-aligned with the first and second spacers 491 and 492, respectively. An upper portion of the well region 404 between the source region 406 and the channel region 413 may correspond to a first trapping region 411, and an upper portion of the well region 404 between the drain region 407 and the channel region 413 may correspond to a second trapping region 412.

Figure 22:
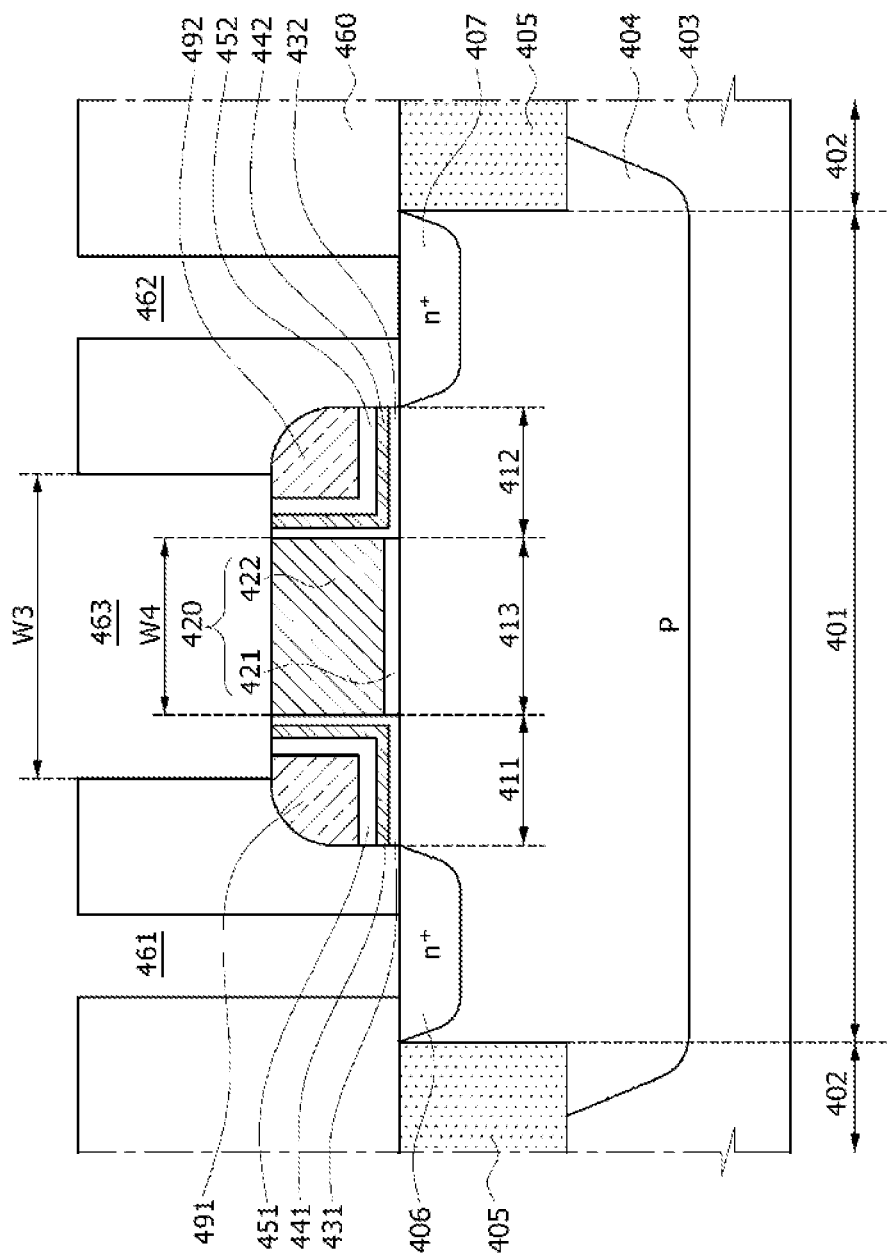

Referring to FIG. 22, an interlayer insulation layer 460 may be formed on an entire surface of the substrate including the source region 406 and the drain region 407. The interlayer insulation layer 460 may be formed of an oxide type insulation material. In some embodiments, the interlayer insulation layer 460 may be formed of a multi-layered insulation layer.

The interlayer insulation layer 460 may be patterned using a mask pattern such as a photoresist pattern to form a first contact hole 461, a second contact hole 462, and a third contact hole 463. The first contact hole 461 may be formed to expose the source region 406, and the second contact hole 462 may be formed to expose the drain region 407. Moreover, the third contact hole 463 may be formed to expose the gate conductive pattern 422 and the first and second spacers 491 and 492. The third contact hole 463 may be formed to have a width W3 which is greater than a width W4 of the gate conductive pattern 422.

Figure 23:
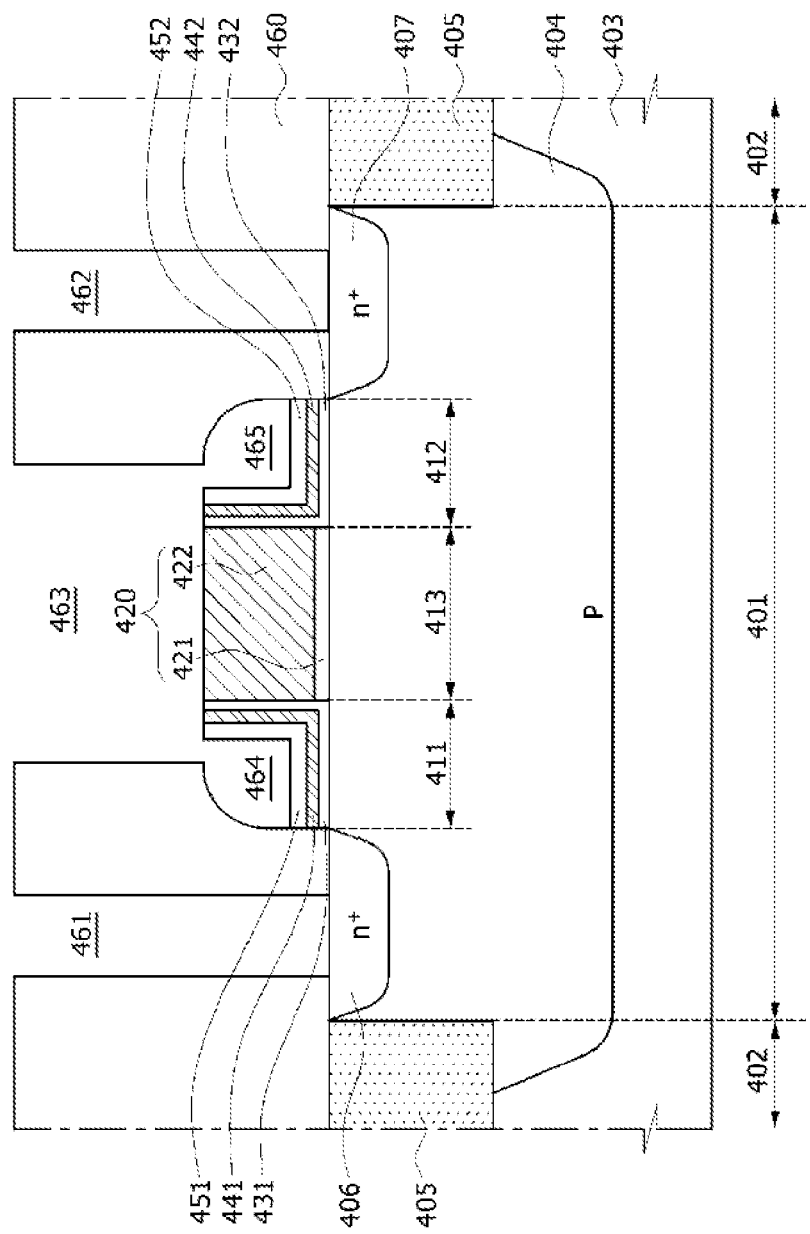

Referring to FIG. 23, the first and second spacers 491 and 492 exposed by the third contact hole 463 may be removed to provide a space 464 and a space 465 exposing the first trapping region 411 and the second trapping region 412, respectively.

To form the space 464 and the space 465, the first and second spacers 491 and 492 may be etched using a wet etch process that employs a chemical solution as an etchant which is capable of selectively removing the first and second spacers 491 and 492. If the first and second spacers 491 and 492 are formed of a nitride layer, the wet etch process for removing the first and second spacers 491 and 492 may be performed using a phosphoric acid ($H_3PO_4$) solution as an etchant. While the first and second spacers 491 and 492 are removed, the ends of the first and second charge trap layers 441 and 442 may also be exposed to the phosphoric acid ($H_3PO_4$) solution. However, each of the first and second charge trap layers 441 and 442 may be formed to be relatively thin. Thus, the first and second charge trap layers 441 and 442 may be hardly etched even though the wet etch process for removing the first and second spacers 491 and 492 is performed. As the first and second spacers 491 and 492 are removed, the third contact hole 463 may be enlarged to form the spaces 464 and 465. Accordingly, the first blocking insulation layer 451 may be exposed by the space 464, and the second blocking insulation layer 452 may be exposed by the space 465.

Figure 24:
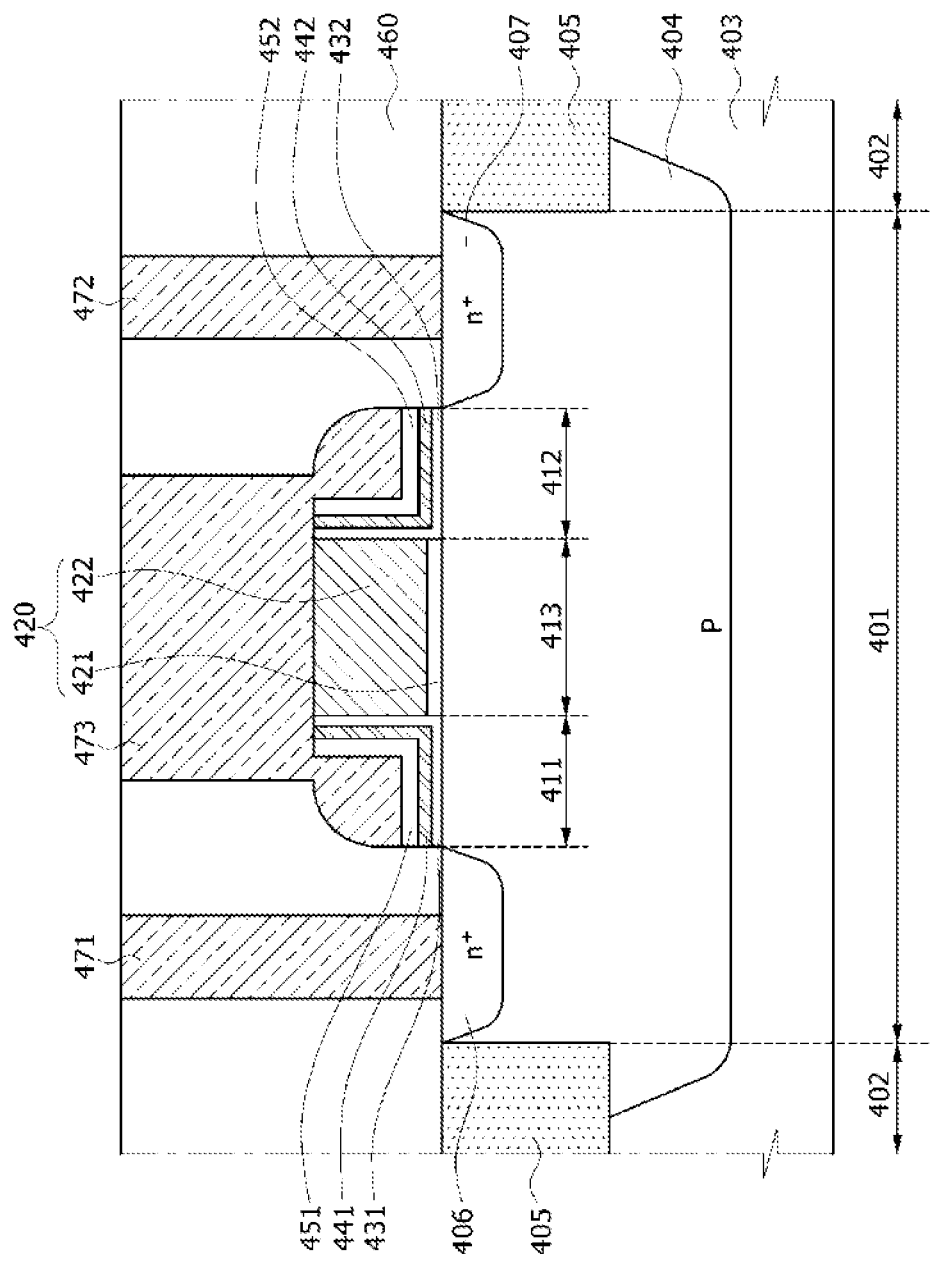

Referring to FIG. 24, the first, second and third contact holes 461, 462 and 463 may be filled with a metal layer to form a first contact plug 471 in the first contact hole 461, a second contact plug 472 in the second contact hole 462, and a third contact plug 473 in the third contact hole 463. In some embodiments, the first, second and third contact plugs 471, 472 and 473 may be formed of a tungsten layer. Alternatively, each of the first, second, and third contact plugs 471, 472 and 473 may be formed to include a plurality of metal layers.

What is claimed is:

1. A charge trapping nonvolatile memory device comprising:
   a source region and a drain region disposed in an upper portion of a substrate and spaced apart from each other by a first trapping region, a channel region, and a second trapping region, wherein the first trapping region, the channel region, and the second trapping region are disposed between the source region and the drain region;
   a gate stack structure disposed over the channel region;
   a first stack including a first tunnel insulation layer, a first charge trap layer, and a first blocking insulation layer disposed over the first trapping region;
   a second stack including a second tunnel insulation layer, a second charge trap layer, and a second blocking insulation layer disposed over the second trapping region;
   an interlayer insulation layer disposed over the substrate and covering the gate stack structure;
   a first contact plug and a second contact plug penetrating the interlayer insulation layer and respectively contacting the source region and the drain region; and
   a third contact plug penetrating the interlayer insulation layer, contacting the gate stack structure and overlapping with the first and the second charge trap layers,
   wherein the third contact plug includes:
      a third upper contact plug contacting a top surface of the gate stack structure; and
      third lower contact plugs extending from the third upper contact plug, each of the third lower contact plugs directly contacting the first blocking insulation layer and second blocking insulation layer, respectively,
   wherein sidewalls of the third lower contact plug are self-aligned with an edge of the source region adjacent to the first trapping region and an edge of the drain region adjacent to the second trapping region, respectively.

2. The device of claim 1, wherein the third upper contact plug has a width greater than a width of the gate stack structure.

3. The device of claim 2, wherein the third upper contact plug vertically overlaps with a portion of the first trapping region adjacent to the channel region and a portion of the second trapping region adjacent to the channel region.

4. The device of claim 1, wherein both ends of the third lower contact plug are self-aligned with an end of the source region and an end of the drain region, respectively.

5. The device of claim 1, wherein the third lower contact plug is surrounded by the interlayer insulation layer and has a rounded sidewall profile.

6. The device of claim 1, wherein an end of the source region and an end of the drain region are self-aligned with both sidewalls of the third lower contact plug, respectively.

7. The device of claim 1, wherein the third contact plug includes the same metal layer as the first and the second contact plugs.

8. The device of claim 7, wherein the metal layer includes a tungsten layer.

9. The device of claim 1,
   wherein the first trapping region is disposed between the source region and the channel region, and
   wherein the second trapping region is disposed between the drain region and the channel region.

10. The device of claim 1,
    wherein the first stack extends from over a first sidewall of the gate stack structure to over the source region, and
    wherein the second stack extends from a second sidewall of the gate stack structure to over the drain region.

11. A charge trapping nonvolatile memory device comprising:
    a plurality of word lines including first, second, and third word lines and arranged along rows;
    a plurality of bit lines respectively disposed along a plurality of columns;
    a plurality of source lines extending in parallel to the rows; and
    a plurality of unit cells respectively located at cross points of the rows and the columns,
    wherein the plurality of unit cells includes a first unit cell located at a Nth row and a Pth column, a second unit cell located at the (N−1)th row and the Pth column, and a third unit cell located at the (N+1)th row and the Pth column, wherein each of N and P is an integer,
    wherein each of the first, the second, and the third unit cells includes a first charge storage transistor, a selection transistor, and a second charge storage transistor which are connected in series along a column direction,
    wherein the first charge storage transistor has a first control gate terminal and a source terminal,
    wherein the selection transistor has a selection gate terminal,
    wherein the second charge storage transistor has a second control gate terminal and a drain terminal,
    wherein the source terminal of the first unit cell is electrically connected to the source terminal of the second unit cell,
    wherein the first control gate terminal, the selection gate terminal, and the second control gate terminal of the first unit cell are commonly connected to a first word line,
    wherein the first control gate terminal, the selection gate terminal, and the second control gate terminal of the second unit cell are commonly connected to a second word line,
    wherein the first control gate terminal, the selection gate terminal, and the second control gate terminal of the third unit cell are commonly connected to a third word line,
    wherein drain terminals of the first, the second, and the third unit cells are commonly connected to the same bit line,
    wherein the source terminals of the first and the second unit cells are commonly connected to the same source line, and
    wherein bulk regions of the plurality of unit cells are commonly connected to the same well bias line.

12. The device of claim 11,
    wherein the first charge storage transistor of each of the first, the second, and the third unit cell has a first charge trap structure including a first tunnel insulation layer, a first charge trap layer, and a first blocking insulation layer; and wherein the second charge storage transistor of each of the first, the second, and the third unit cell has a second charge trap structure including a second tunnel insulation layer, a second charge trap layer, and a second blocking insulation layer.

* * * * *